(12) United States Patent
Kawaguchi et al.

(10) Patent No.: US 7,115,946 B2
(45) Date of Patent: Oct. 3, 2006

(54) MOS TRANSISTOR HAVING AN OFFSET REGION

(75) Inventors: Yusuke Kawaguchi, Miura-gun (JP); Kazutoshi Nakamura, Yokohama (JP); Akio Nakagawa, Fujisawa (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 550 days.

(21) Appl. No.: 09/956,015

(22) Filed: Sep. 20, 2001

(65) Prior Publication Data

US 2002/0050619 A1 May 2, 2002

(30) Foreign Application Priority Data

Sep. 28, 2000 (JP) ............................. 2000-296827
Sep. 28, 2000 (JP) ............................. 2000-296834

(51) Int. Cl.
*H01L 29/76* (2006.01)
(52) U.S. Cl. ...................... 257/339; 257/335; 257/340; 257/E29.023
(58) Field of Classification Search ................ 257/268, 257/286, 326, 336, 408, 335, 339, 340, 288, 257/327, E29.023
See application file for complete search history.

(56) References Cited

U.S. PATENT DOCUMENTS 5,747,850 A * 5/1998 Mei ........................... 257/328
5,932,897 A    8/1999 Kawaguchi et al.
6,025,237 A * 2/2000 Choi ........................... 438/301

2002/0050619 A1   5/2002  Kawaguchi et al.

FOREIGN PATENT DOCUMENTS

JP          10-321853         12/1998

OTHER PUBLICATIONS

R. Zhu, V. Parthasarathy, J. Capilla, W. Peterson, M. Bacchi, M. Zunino, and R. Baird, "Suppression of Substrate Injection by RESURF LDMOS Dev.in a Smart Power Techn.for 20-30V Applications," Proc. Bipolar/BiCMOS Circuits and Tech.,Mtg. (1998) pp. 184-186.*
V.Parthasarathy, V. Khemka, R. Zhu, and A. Bose, SOA Improvement by a Double RESURF LDMOS Technique in a Power IC Technology, Proc. Int'l Electron Devices Mtg., (2000) pp. 4.2.1-4. 2.4.*

(Continued)

*Primary Examiner*—Douglas W. Owens
*Assistant Examiner*—Samuel A Gebremariam
(74) *Attorney, Agent, or Firm*—Oblon, Spivak, McClelland, Maier & Neustadt, P.C.

(57) ABSTRACT

A semiconductor device includes a semiconductor region of a first conductivity type, a drain region of the first conductivity type, an offset region of the first conductivity type, a body region of the second conductivity type, a source region of the first conductivity type, a gate insulating film and a gate electrode. The drain region is provided in a surface of the semiconductor region and is shaped like a stripe. The offset region is provided in the surface of the semiconductor region and surrounds the drain region. The body region is provided in the surface of the semiconductor region and surrounds the offset region. The source region is provided in a surface of the body region and surrounds the offset region. The gate insulating film is provided on a part of the body region. The gate electrode is provided on the gate insulating film.

18 Claims, 21 Drawing Sheets

OTHER PUBLICATIONS

Zahir Parpia and C. Andre T. Salama, "Optimization of RESURF LDMOS Transistors: An Analytical Approach," IEEE Trans. on Electron Devices, vol. 17, No. 3, (Mar. 1990), pp. 789-796.*

S. Wolf, "Silicon Processing for the VLSI Era: vol. 2-Process Intergration," Lattice Press, Sunset Beach, CA (1990), p. 390.*

Yasuke Kawaguchi, et al., "A Low On-Resistance 60 V MOSFET High Side Switch and a 30 V npn Transistor Based on 5 V BiCMOS Process", IEEE BCTM 9.3, 1997, pp. 151-154.

U.S. Appl. No. 11/261,531, filed Oct. 31, 2005, Nakamura et al.

* cited by examiner

MOS TRANSISTOR HAVING AN OFFSET REGION

CROSS-REFERENCE TO RELATED APPLICATIONS

This application is based upon and claims the benefit of priority from the prior Japanese Patent Applications No. 2000-296827, filed Sep. 28, 2000; and No. 2000-296834, filed Sep. 28, 2000, the entire contents of both of which are incorporated herein by reference.

BACKGROUND OF THE INVENTION

1. Field of the Invention

The present invention relates to a semiconductor device. More particularly, the invention relates to a technique applied to a power MOS transistor having a high breakdown voltage.

2. Description of the Related Art

Hitherto known is a power IC comprising a semiconductor device having a high breakdown voltage and a semiconductor device having a low breakdown voltage, both provided on the same substrate. The power IC further comprises a power MOS transistor at the output stage. The power MOS transistor needs to have both a high breakdown voltage and a low on-resistance.

A conventional power MOS transistor will be described, with reference to FIGS. 1A and 1B. FIG. 1A is a plan view of the MOS transistor, which is an LDMOS (Lateral Double-Diffused MOS) transistor. FIG. 1B is a sectional view taken along line 1B—1B shown in FIG. 1A.

As FIGS. 1A and 1B show, an n$^-$-type epitaxial silicon layer 11 is provided in a surface of a p-type silicon substrate 10. An n$^+$-type buried layer 12 is provided in the junction between the substrate 10 and the layer 11. Body regions 13 (p-type impurity-diffused layers), which are shaped like a strip, are provided in the surface of the epitaxial silicon layer 11. In each body region 13, a source region 14 (n$^+$-type impurity-diffused layer) and a contact region 15 (p$^+$-type impurity-diffused layer) are provided. A drain region 16 (n$^+$-type impurity-diffused layer) and an offset region 17 (n$^-$-type impurity-diffused layer) are provided in the surface of the epitaxial silicon layer 11. The drain region 16 surrounds the body region 13. The offset region 17 surrounds the drain region 16. In the epitaxial silicon layer 11, sinker layers 18 extend downwards, from the surface of the layer 11 to the buried layer 12. On the silicon layer 11 there are provided gate insulating films 19 and LOCOS (LOCal Oxidation of Silicon) insulating films 20. Each gate insulating film 19 lies on the body region 13 and is connected to the adjacent LOCOS insulating film 20, which reaches a drain region 16. Gate electrodes 21 are provided, each partly on a gate insulating film 19 and partly on the LOCOS insulating film 20 connected to the film 19. Each gate electrode 21 surrounds one body region 13. Drain electrodes 22 lie on the drain regions 16. Source electrodes 23 are provided, each on one source region 14 and one contact region 15. Thus, LDMOS transistors have been formed.

FIG. 2A is a sectional view of another conventional LDMOS transistor.

As is illustrated in FIG. 2A, a p-type well region 25 is provided in one surface of a silicon substrate 10. A source region 14 (n$^+$-type impurity-diffused layer) and an offset region 17 (n$^-$-type impurity-diffused layer) are provided in the surface of the well region 25 and spaced apart from each other. A contact region 15 (p$^+$-type impurity-diffused layer) is provided in the surface of the well region 25 and contacts the source region 14. A drain region 16 (n$^+$-type impurity-diffused layer) is provided in the surface of the offset region 17 and isolated from the well region 25. A gate insulating film 19 lies on the well region 25 and extends from the source region 14 to the offset region 17. A gate electrode 21 is provided on the gate insulating film 19. An inter-layer insulating film 26 lies on the well region 25 and covers the gate electrode 21. A gate electrode 22 and a drain electrode 23 are provided in the inter-layer insulating film 26. Thus, an LDMOS transistor has been formed.

FIG. 2B represents the impurity-concentration profile in the plane taken along line 2B—2B shown in FIG. 2A. In FIG. 2B, the impurity concentration is plotted on the ordinate, and the depth, measured from the drain region 16, is plotted on the abscissa.

As seen from FIG. 2B, the drain region 16 is about 0.12 μm deep from its upper surface. The offset region 17 is about 0.13 μm deep from the upper surface of the drain region 16. Namely, the offset region 17 is formed to a depth slightly greater than the depth to which the drain region 16 is formed, in the conventional power MOS transistor.

BRIEF SUMMARY OF THE INVENTION

A semiconductor device according to an aspect of the present invention comprises: a semiconductor region of a first conductivity type; a drain region of the first conductivity type, provided in a surface of the semiconductor region and shaped like a stripe; an offset region of the first conductivity type, provided in the surface of the semiconductor region and surrounding the drain region; a body region of the second conductivity type, provided in the surface of the semiconductor region and having a shape surrounding the offset region and the drain region on all sides in a horizontal plane of the semiconductor region; a source region of the first conductivity type, provided in a surface of the body region and having a shape surrounding the offset region and the drain region on all sides in a horizontal plane of the semiconductor region; a gate insulating film provided on that part of the body region which lies between the offset region and the source region; and a gate electrode provided on the gate insulating film.

DETAILED DESCRIPTION OF THE INVENTION

Figure 3A:
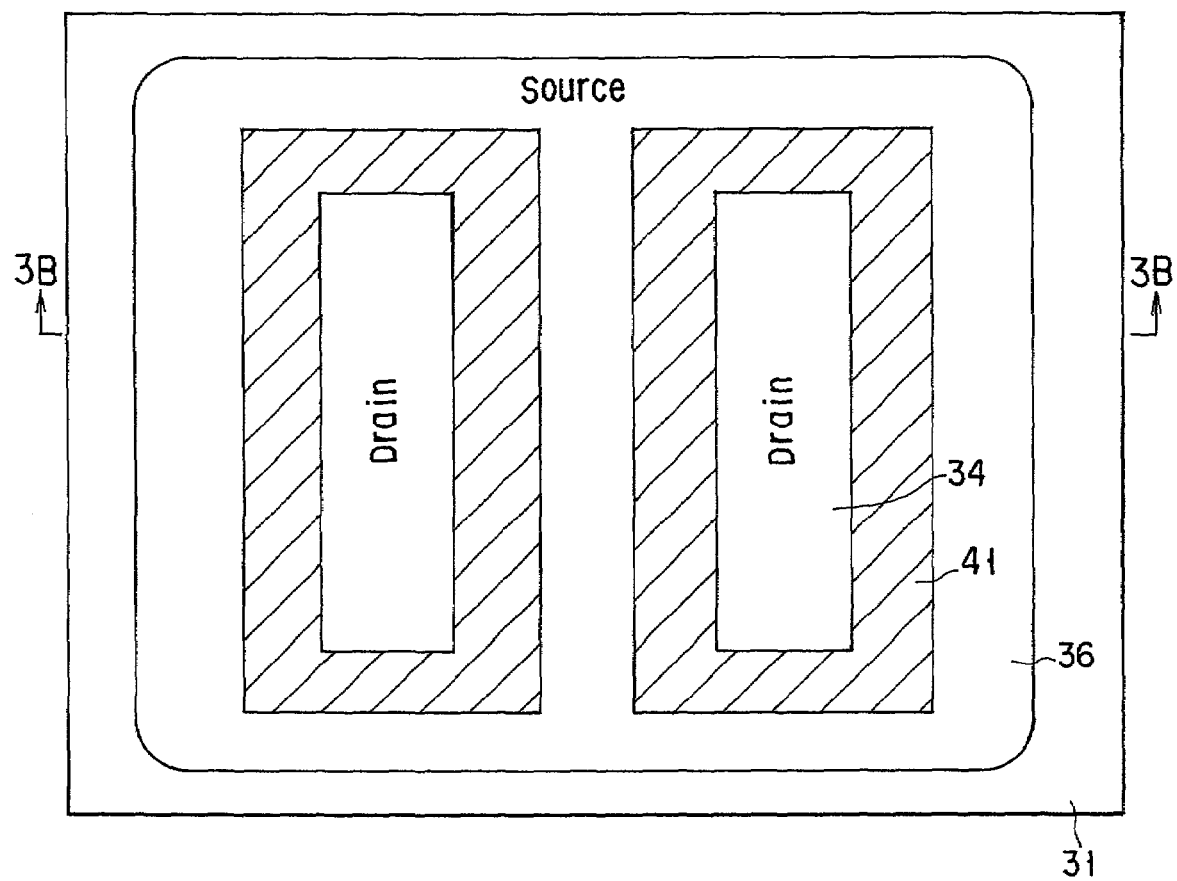
FIG. 3A is a plan view of a MOS transistor according to the first embodiment of the present invention.
Figure 3B:
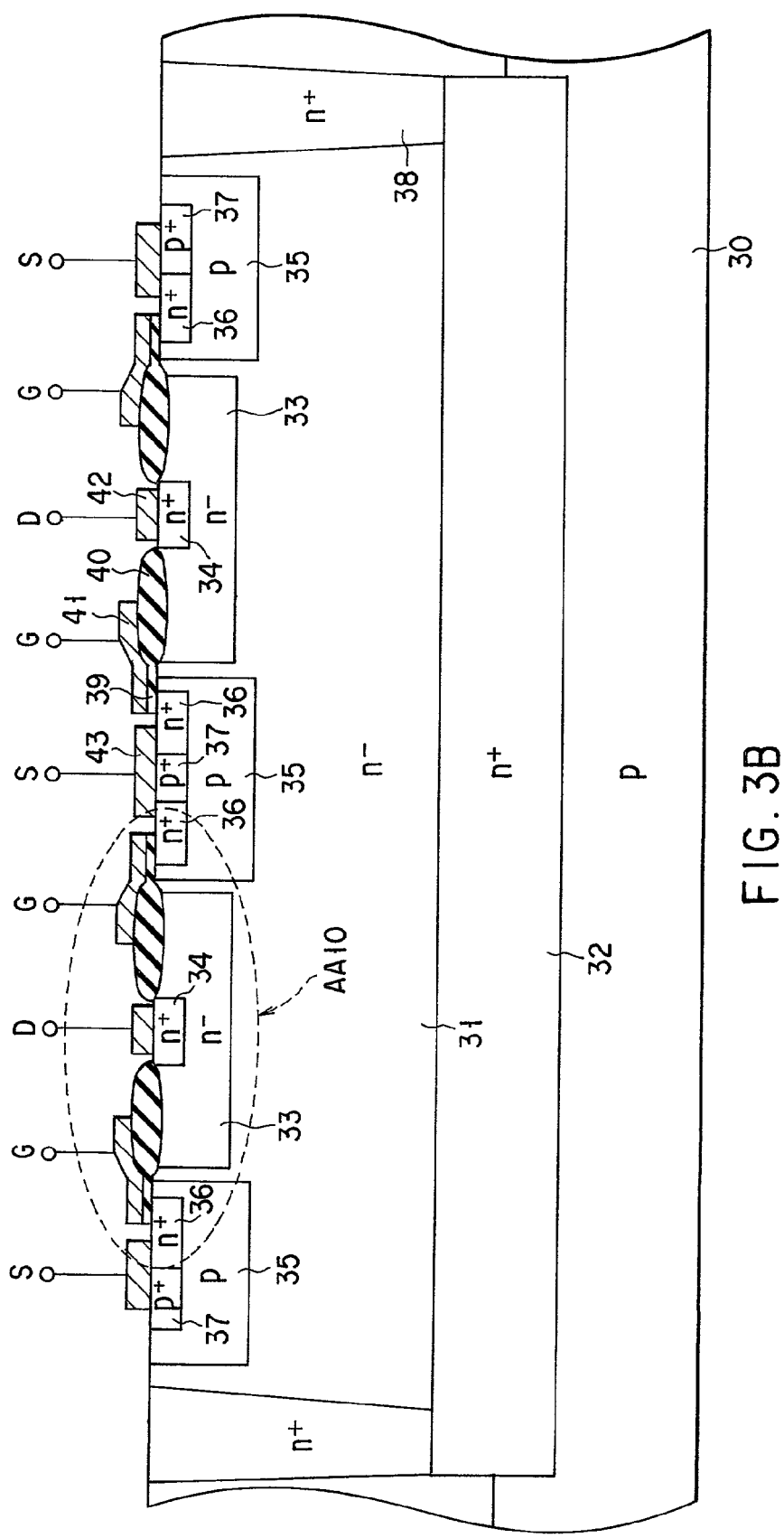
FIG. 3B is a sectional view taken along line 3B—3B shown in FIG. 3A.

FIG. 3A is a plan view of an LDMOS transistor according to the first embodiment of the present invention. FIG. 3B is a sectional view taken along line 3B—3B shown in FIG. 3A.

As shown in FIGS. 3A and 3B, an $n^-$-type epitaxial silicon layer 31 is provided in a surface of a p-type silicon substrate 30. An $n^+$-type buried layer 32 is provided in the junction between the substrate 30 and the layer 31. Offset regions 33 ($n^-$-type impurity-diffused layers), shaped like a strip, are provided in the surface of the epitaxial silicon layer 31. Drain regions 34 ($n^+$-type impurity-diffused layers), shaped like a strip, too, are provided, each in the surface of one offset region 33. Body regions 35 (p-type impurity-diffused layers) are provided in the surface of the silicon layer 31, each surrounding one offset region 33. A source region 36 ($n^+$-type impurity-diffused layer) is provided in each body region 35 and surrounds the offset region 33. Each body region 35 has rounded corners. A contact region 37 ($p^+$-type impurity-diffused layer) is provided in each body region 35, to contact an electrode. In the epitaxial silicon layer 31, sinker layers 38 ($n^+$-type impurity-diffused layers) extend downwards, from the surface of the layer 31 to the $n^+$-type buried layer 32. On the silicon layer 31 there are provided gate insulating films 39 and LOCOS (Local Oxidation of Silicon) insulating films 40. Each gate insulating film 39 lies on a body region 35 and is connected to the adjacent LOCOS insulating film 40, which reaches a drain region 34. Gate electrodes 41 are provided, each partly on a gate insulating film 39 and partly on the LOCOS insulating film 40 connected to the film 39. Each gate electrode 41 surrounds one drain region 34. Drain electrodes 42 lie on the drain regions 34. Source electrodes 43 are provided, each on one source region 36 and one contact region 37. Thus, LDMOS transistors have been formed.

The MOS transistor shown in FIGS. 3A and 3B has a large channel width, because its drain region 34 and source region 36 are shaped like a strip. The MOS transistor can therefore perform a large-current operation. Additionally, the $n^+$-type buried layer 32 electrically isolates the body region 35 from the silicon substrate 30 while the MOS transistor is operating as a high-side switch. The $n^+$-type buried layer 32 is set at the same potential as, for example, the drain region 34.

Figure 1B:
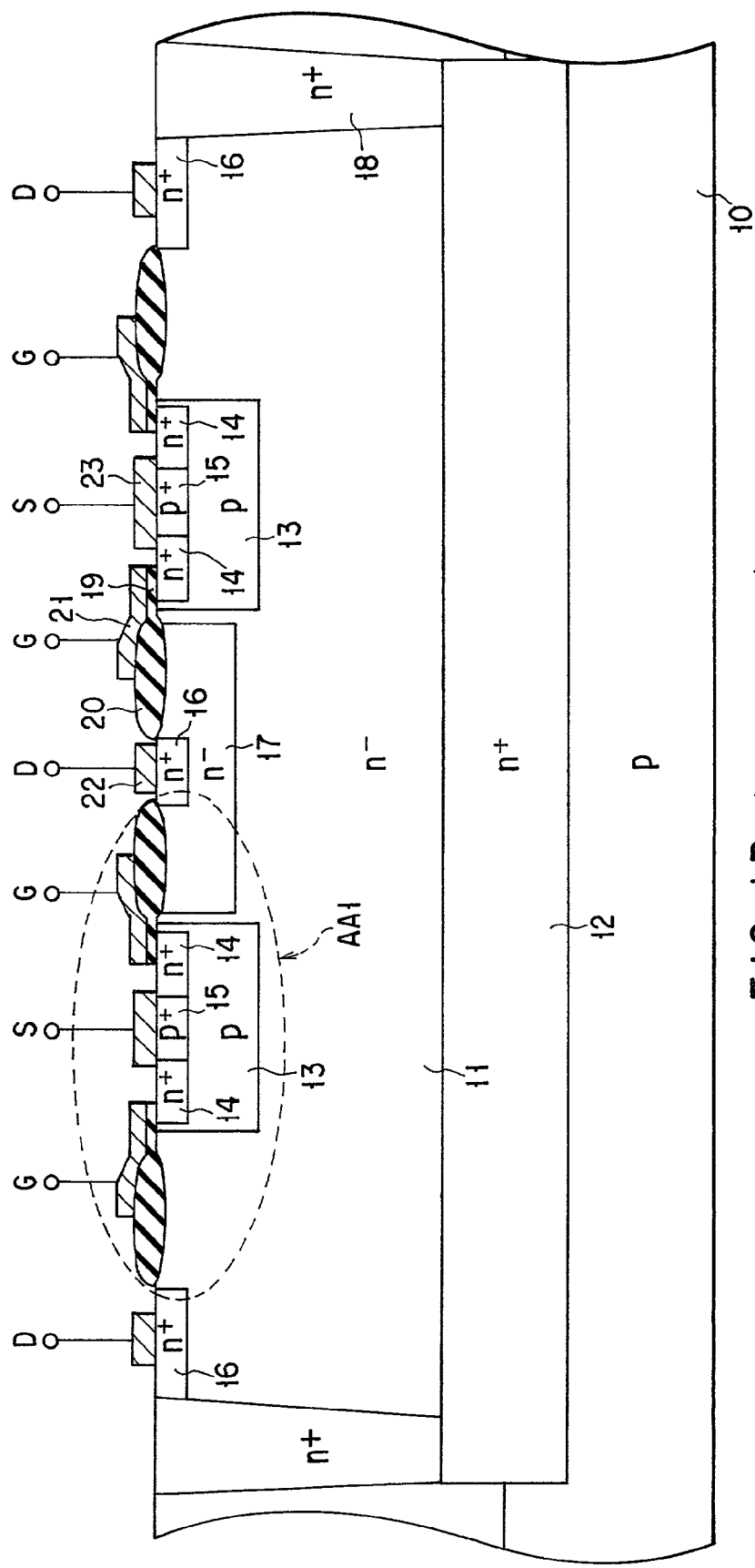
FIG. 1B is a sectional view, taken along line 1B—1B shown in FIG. 1A.
Figure 4A:
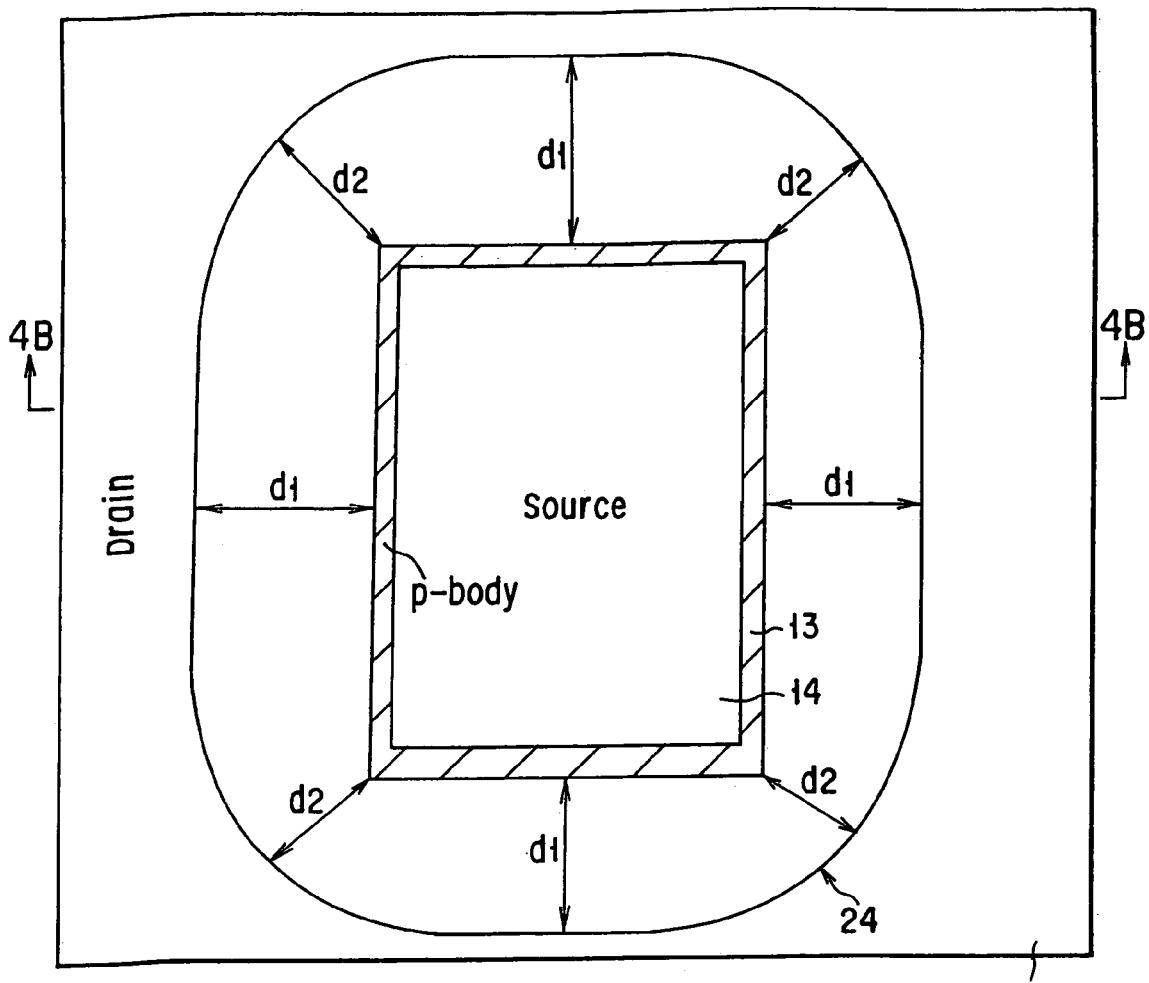
FIG. 4A is a magnified view showing a part of the MOS transistor shown in FIG. 1A.
Figure 4B:
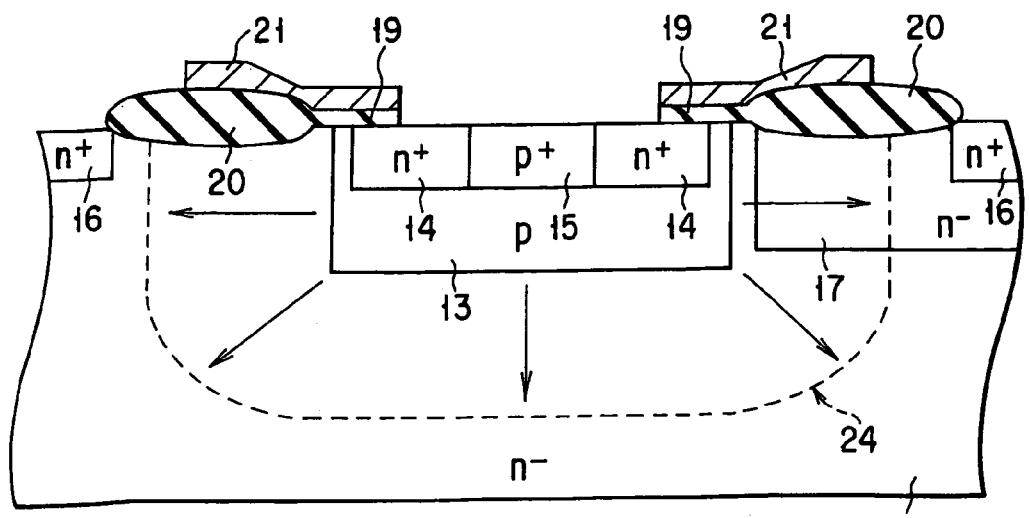
FIG. 4B is a sectional view, taken along line 4B—4B shown in FIG. 4A.
Figure 5A:
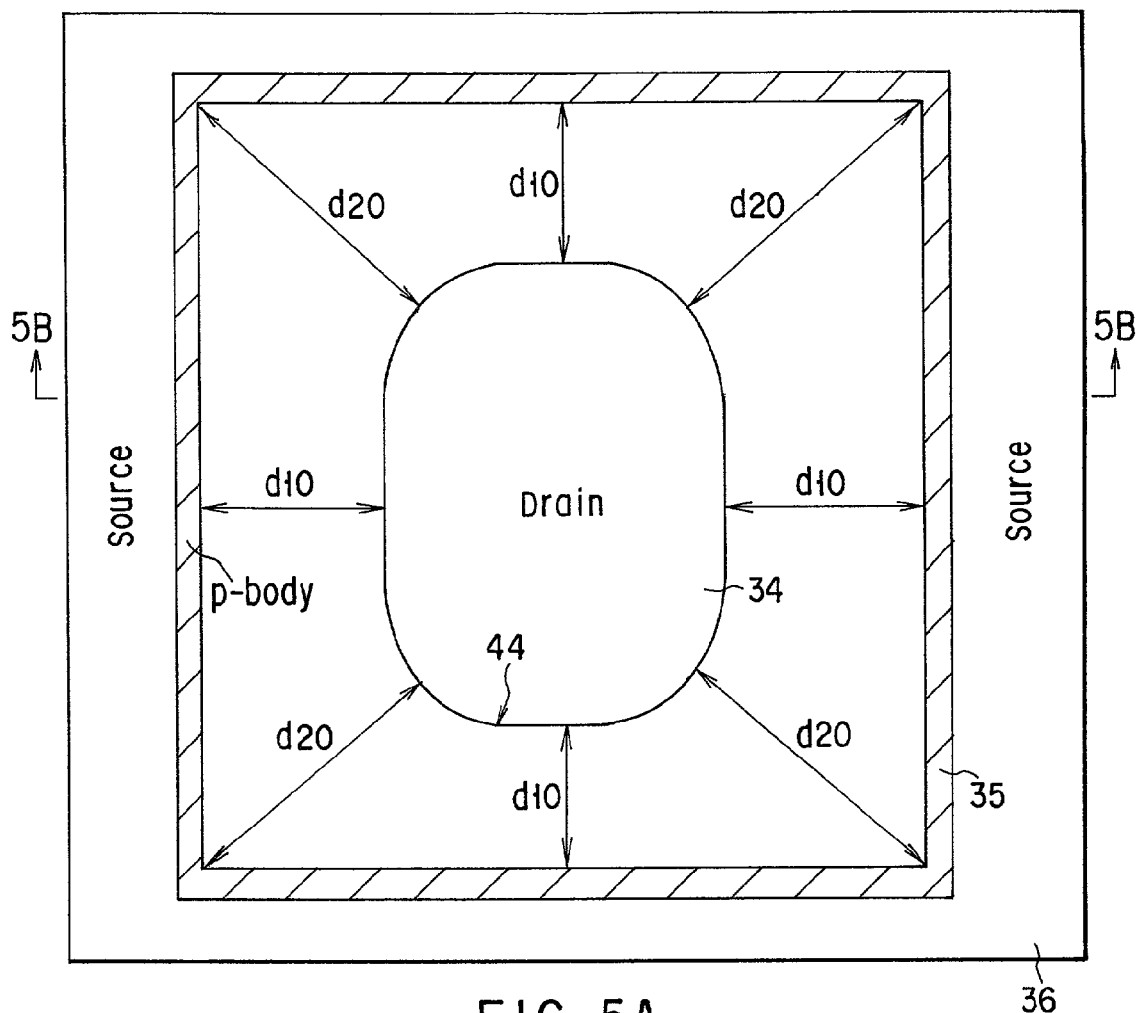
FIG. 5A is a magnified view showing a part of the MOS transistor shown in FIG. 3A.
Figure 5B:
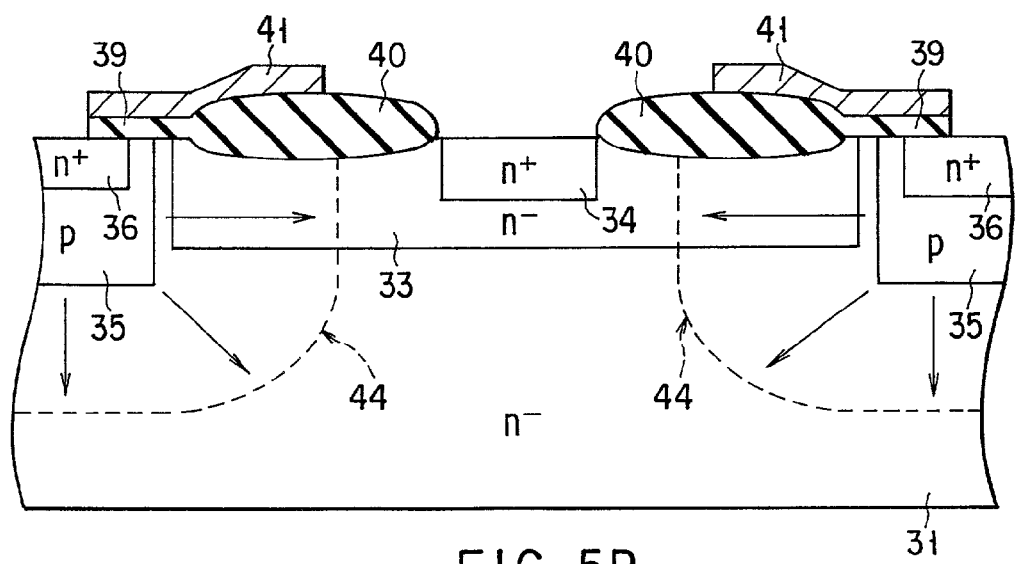
FIG. 5B is a sectional view, taken along line 5B—5B shown in FIG. 5A.

The MOS transistor can have a high breakdown voltage. The MOS transistor achieving this advantage will be described, in comparison with the conventional MOS transistor. FIGS. 4A and 4B are magnified views of a region AA1 of the conventional LDMOS transistor shown in FIG. 1B. More specifically, FIG. 4A is a plan view of the transistor, and FIG. 4B is a sectional view taken along line 4B—4B shown in FIG. 4A. FIGS. 5A and 5B are magnified views of a region AA10 of the LDMOS transistor according to this embodiment of the invention, illustrated in FIG. 3B. More precisely, FIG. 5A is a plan view of the transistor, and FIG. 5B is a sectional view taken along line 5B—5B shown in FIG. 5A.

As shown in FIGS. 4A and 4B, a pn junction is provided at the interface between the body region 13 and the epitaxial silicon layer 11, the offset region 17. Due to the pn junction, a depletion layer 24 is formed in the silicon layer 11 and the offset layer 17. The depletion layer 24 expands outwards from the body region 13 since the body region 13 is shaped like a strip as indicated above. Assume that the depletion layer 24 formed at the pn junction when a voltage applied to the pn junction has a width d1. Then, the depletion layer 24 can expand by the width d1 in the region where the body region 23 extends straight. In any corner part of the body region 13, however, the body region 13 cannot sufficiently expand and the depletion layer has a width d2 that is smaller than width d1 (d2<d1). Consequently, the electric field concentrates in the depletion layer which exists at the corners of the body region 13. This inevitably lowers the breakdown voltage of the MOS transistor.

The MOS transistor according to this embodiment of the present invention will be described, with reference to FIGS. 5A and 5B.

As in the conventional MOS transistor, a pn junction is provided at the interface between the body region 35 and the epitaxial silicon layer 31, the offset region 33. Due to the pn junction, a depletion layer 44 is formed in the silicon layer 31 and the offset region 33. The body region 35 has an impurity concentration higher than those of the epitaxial silicon layer 31 and offset region 33. A greater part of the depletion layer 44 exists in another region that forms a pn junction, jointly with the body region 35 (that is, in the silicon layer 31 and offset region 33). The body region 35 surrounds the offset region 34. Hence, the depletion layer 44 expands into the region surrounded by the body region 35, unlike in the convention MOS transistor. The depletion layer 44 is therefore broad at the parts that exist in the corners of the body region 35. Assume that the depletion layer 44 formed at the pn junction when a voltage applied to the pn junction has a width d10. Then, the depletion layer 44 can expand by the width d10 in the region where the body region 35 extends straight. In any corner part of the body region 35, two depletion layers are formed and combined, each expanding to have width d10. The resultant depletion layer has a width d20, which is greater than width d10 (d20>d10).

As seen from in FIG. 3A, the body region 35 has rounded corners. The radius of the rounded corners can be set at any desired value. The larger the radius, the greater the width of the depletion layer formed in each corner of the body region 35. The greater the width of the depletion layer, the more easily can the concentration of an electric field be prevented.

In the MOS transistor according to this embodiment of this invention, the depletion layer can greatly expand at the portions existing in the corners of the body region. The electric field is therefore least likely to concentrate in the corners of the body region, whereas an electric field is most likely to concentrate in the corners of the body region in the conventional MOS transistor. In addition, the electric field does not concentrate in the depletion layer that expands outwards from the body region, because the body region has rounded corners. The MOS transistor can have a high breakdown voltage.

To be more specific, if the case where the source and the drain are spaced apart by 6.5 μm, the offset length is 3.3 μm and the offset region has an impurity concentration of $2.0 \times 10^{12}$ cm$^{-2}$, the MOS transistor has a breakdown voltage of 77 V, while the conventional MOS transistor has a breakdown voltage of 22 V. Thus, this embodiment of the present invention can increase the breakdown voltage of MOS transistors.

A method of manufacturing the MOS transistor described above will be explained, with reference to FIGS. 6A to 6J. FIGS. 6A to 6J are sectional views explaining the steps of the method.

Figure 6A:
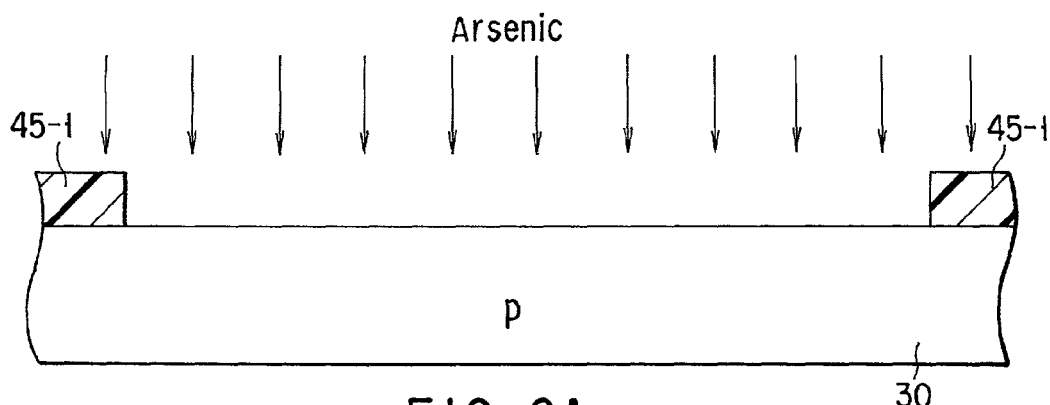
FIGS. 6A to 6J are sectional views explaining the steps of the method of manufacturing the MOS transistor according to the first embodiment of the invention.

First, a mask member 45-1 is formed on a p-type silicon substrate 30. Photolithography is performed, making an opening in the member 45-1 as shown in FIG. 6A. That region of the substrate 30 in which an n$^+$-type buried layer 32 will be formed is exposed through the opening of the mask member 45-1. Using the mask member 45-1 as mask, n-type impurity, such as arsenic, is introduced into the surface of the p-type silicon substrate 30.

Figure 6B:
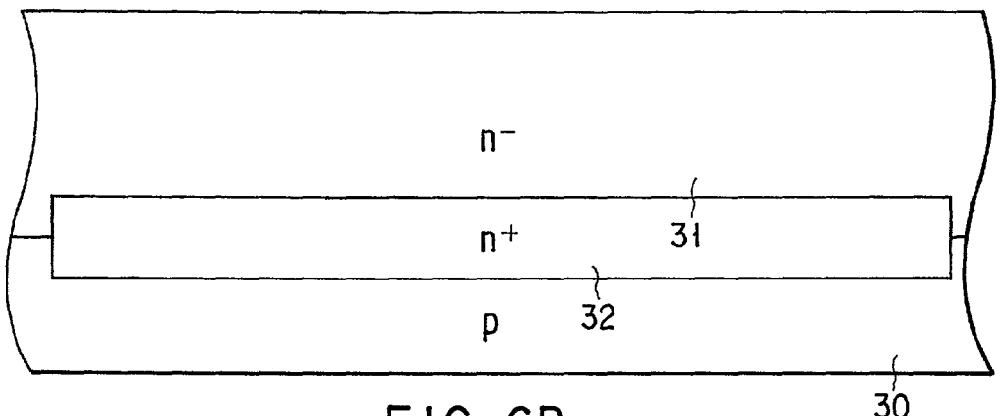

The mask member 45-1 is removed from the p-type silicon substrate 30. Thereafter, as shown in FIG. 6B, an n$^+$-type silicon layer 31 is formed on the silicon substrate 30 by means of epitaxial growth such as CVD (Chemical Vapor Deposition). During the epitaxial growth, the n-type impurity introduced into the substrate 30 as is illustrated in FIG. 6B diffuses in the silicon substrate 30 and into the epitaxial silicon layer 31. An n$^+$-type buried layer 32 is thereby formed as shown in FIG. 6B.

Figure 6C:
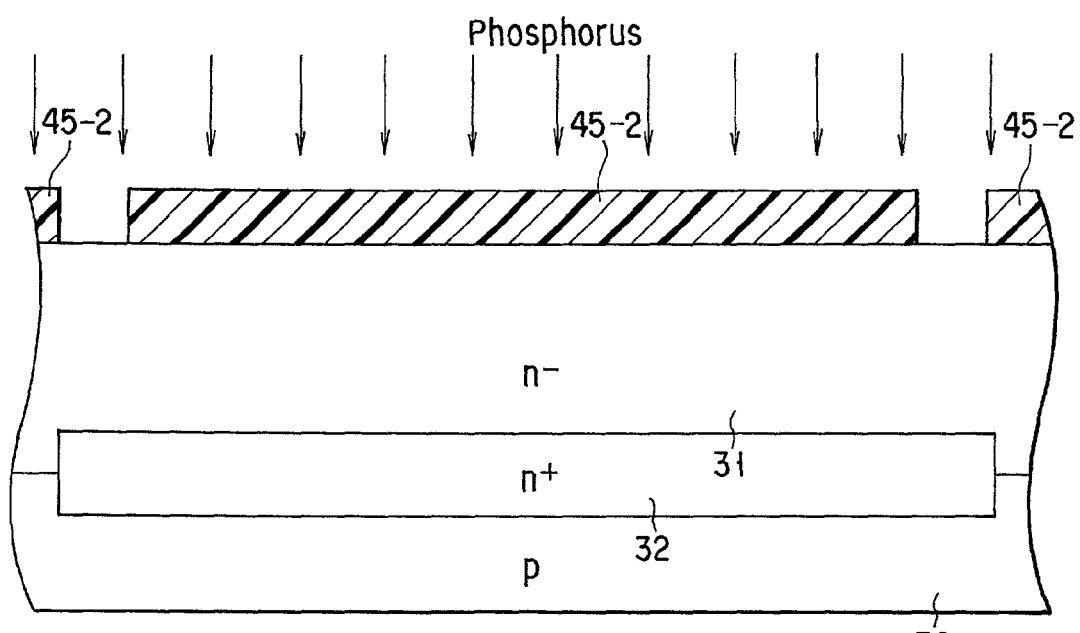

A mask member 45-2 is formed on the epitaxial silicon layer 31. Photolithography is performed, making openings in the mask member 45-2, as shown in FIG. 6C. Through the openings, sinker layers 38 will extend. Using the mask member 45-2 as mask, n-type impurity, such as phosphorus, is introduced into the surface of the epitaxial silicon layer 31 by ion implantation or the like.

Figure 6D:
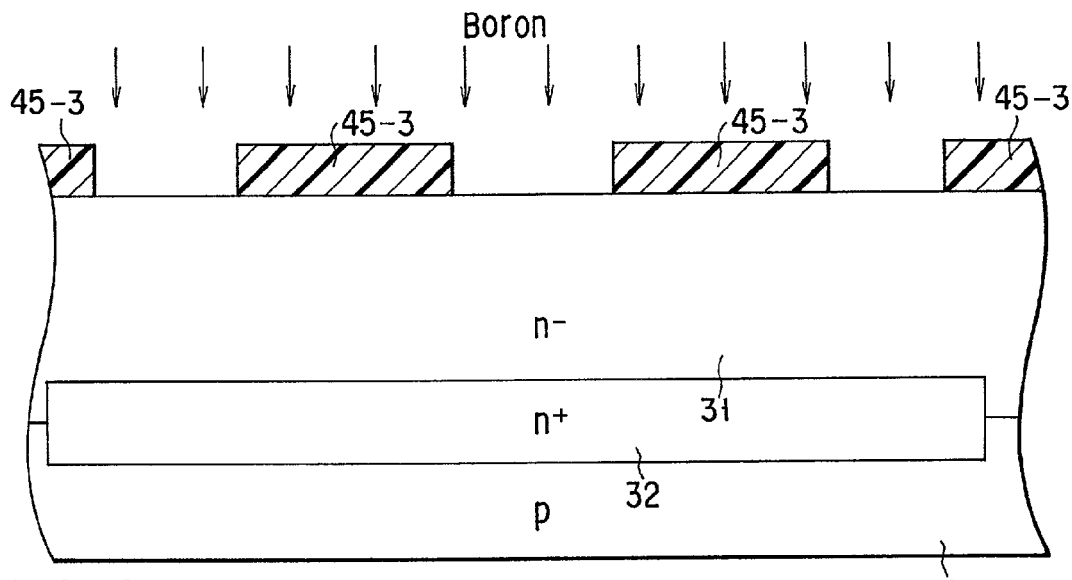

The mask member 45-2 is removed from the epitaxial silicon layer 31. Then, a mask member 45-3 is formed on the epitaxial silicon layer 31. Photolithography is carried out, making openings in the member 45-3 as shown in FIG. 6D. Those regions of the silicon layer 31 in which body regions 35 will be formed are exposed through the openings of the mask member 45-3. Note that the mask member 45-3 is so patterned that each body region 35 will have rounded corners. Using the mask member 45-3 as mask, a p-type impurity, such as boron, is introduced into the surface of the epitaxial silicon layer 31 by ion implantation or the like.

Figure 6E:
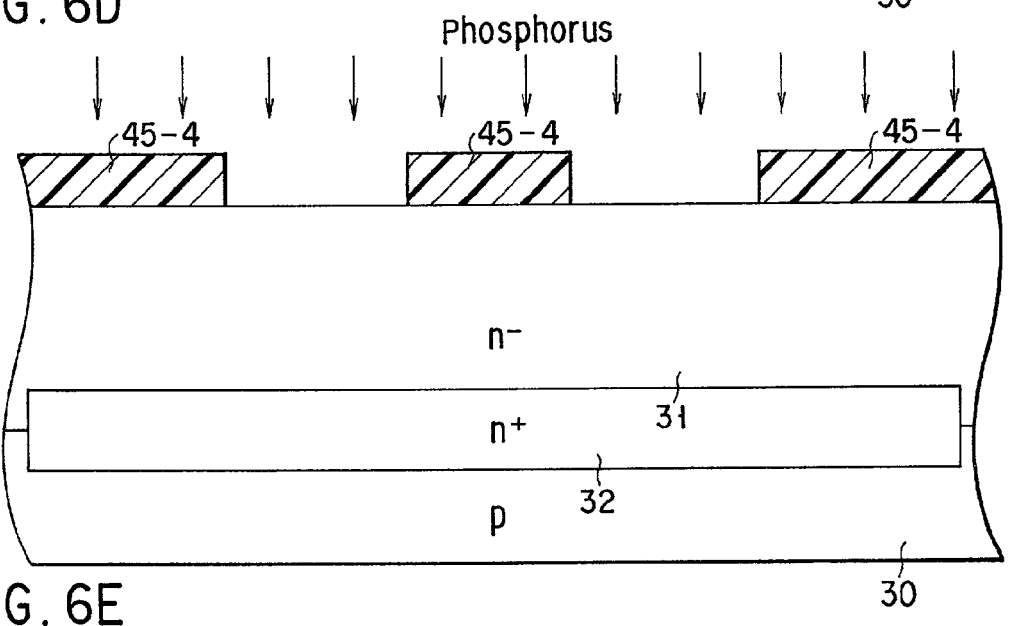

The mask member 45-3 is removed from the epitaxial silicon layer 31. A mask member 45-4 is formed on the epitaxial silicon layer 31. Photolithography is carried out, making openings in the member 45-4 as shown in FIG. 6E. Those regions of the silicon layer 31 in which offset regions 33 (i.e., regions to be surrounded by the body regions) will be formed are exposed through the openings of the mask member 45-4. Using the mask member 45-4 as mask, an n-type impurity, such as phosphorus, is introduced into the surface of the epitaxial silicon layer 31 by ion implantation or the like.

Figure 6F:
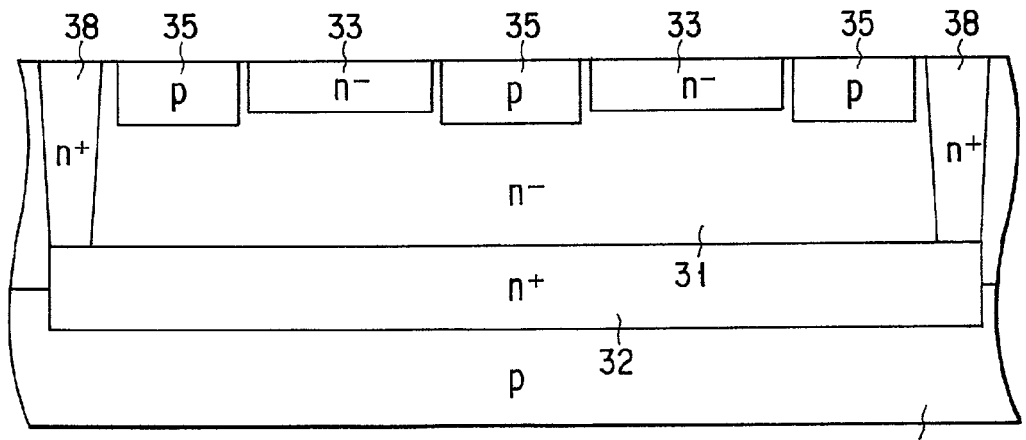

Thereafter, the mask member 45-4 is removed from the epitaxial silicon layer 31. The silicon substrate 30 and the epitaxial silicon layer 31 are heat-treated, diffusing the impurities introduced into the layer 31 in the steps described with reference to FIGS. 6A to 6E. The n$^+$-type sinker layers 38, p-type body regions 35 and n$^-$-type offset regions 33 are thereby formed, as is illustrated in FIG. 6F.

Figure 6G:
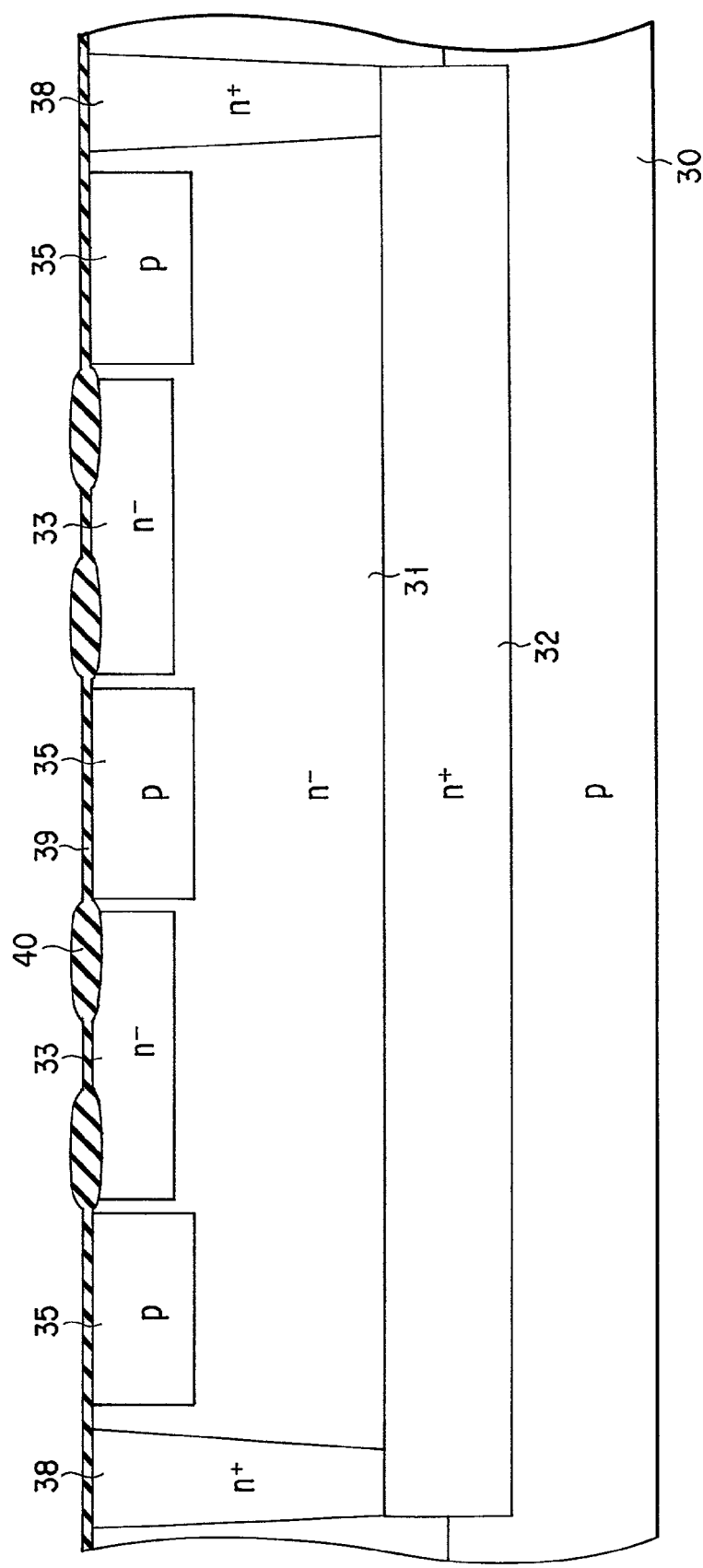

As shown in FIG. 6G, oxide films 40, which are relatively thick, are formed, each on the edge parts of one n$^-$-type offset region 33 by the LOCOS method. The LOCOS oxide films 40 are shaped like a frame, each surrounding the center part of the offset region 33. Then, gate-insulating films 39 are formed on the epitaxial silicon layers 31. The gate insulating films 39 are made of, for example, silicon oxide ($SiO_2$).

Figure 6H:
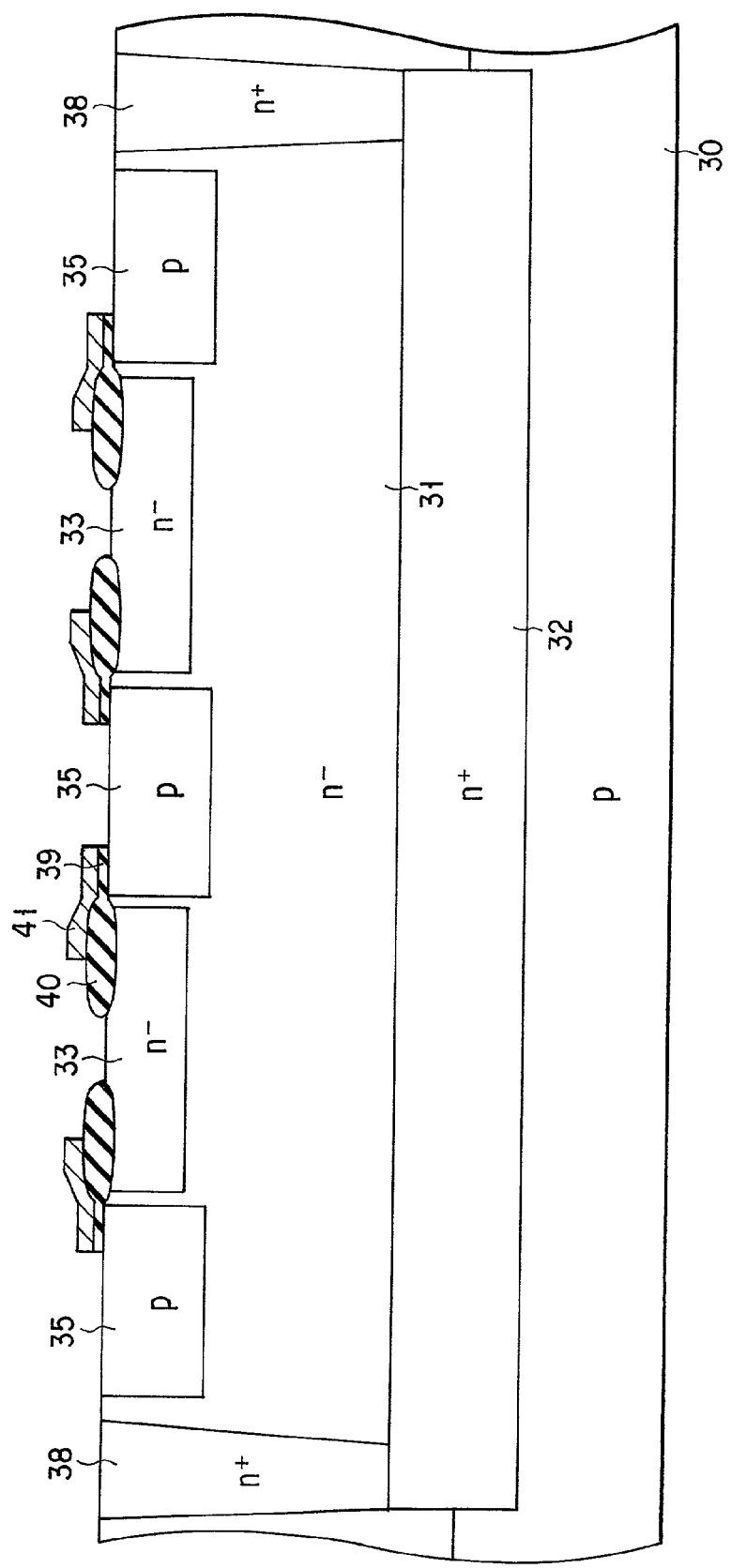

Next, a polycrystalline silicon film is formed on the gate insulating films 39 and the LOCOS oxide films 40 by CVD. The polycrystalline silicon film is patterned, forming gate electrodes 41 as shown in FIG. 6H. Each gate electrode 41 lies on one insulating film 39 and the LOCOS oxide film 40 continuous to the gate insulating film 39 and surrounds the center part of the offset region 33.

Figure 6I:
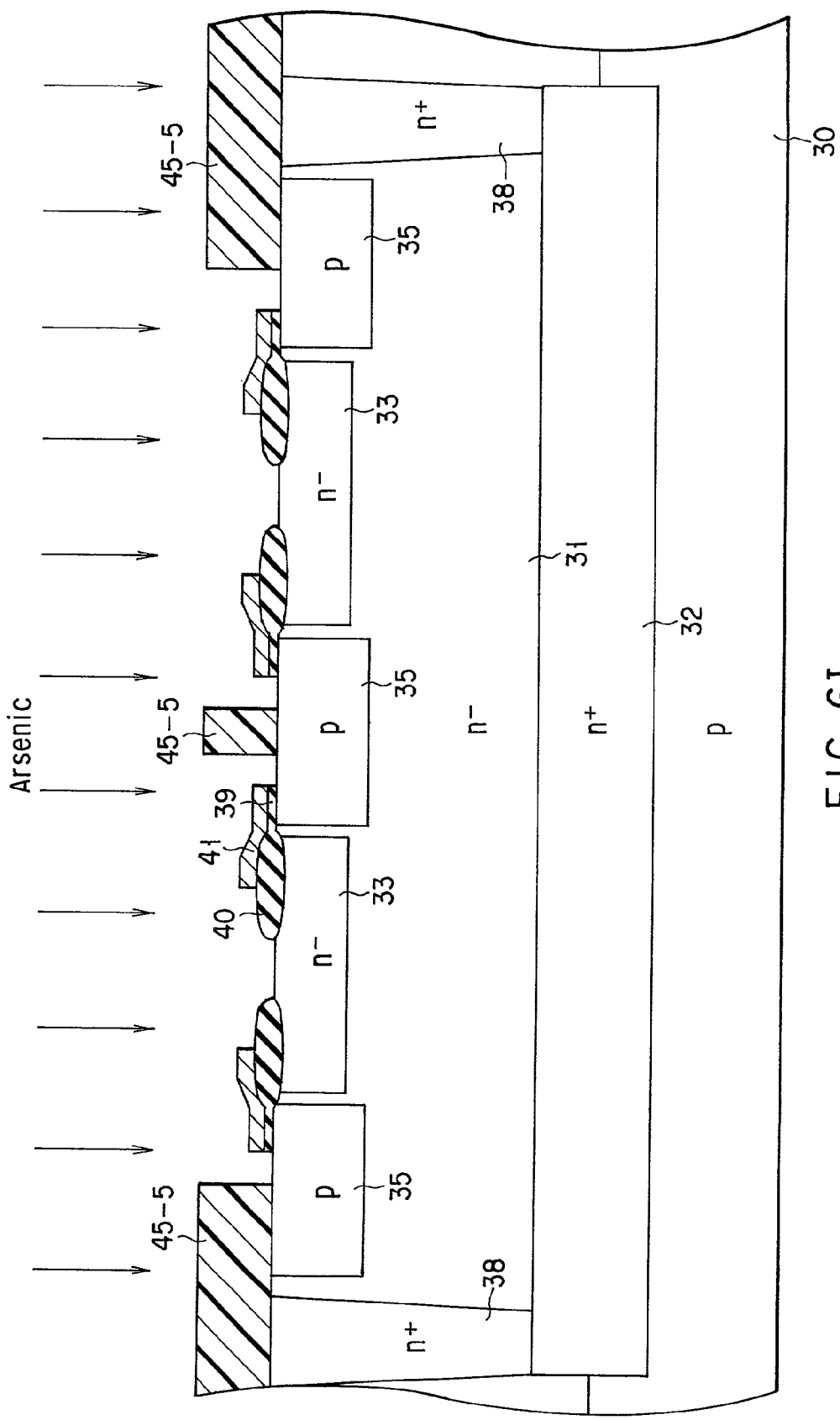

A mask member 45-5 is formed on the epitaxial silicon layer 31. Photolithography is performed, making an opening in the member 45-5 as shown in FIG. 6I. That part of the silicon layer 31 in which source regions 36 and drain regions 34 will be formed is exposed through the opening of the mask member 45-5. The openings of the mask member 45-5 corresponding to drain regions shaped like a strip. The openings corresponding to source regions shaped like a frame surrounding the drain region. Thereafter, using the mask pattern 45-5 and gate electrodes 41 as mask, an n-type impurity such as arsenic is introduced into the surfaces of the body regions 35 and offset regions 33, by means of ion implantation or the like.

Figure 6J:
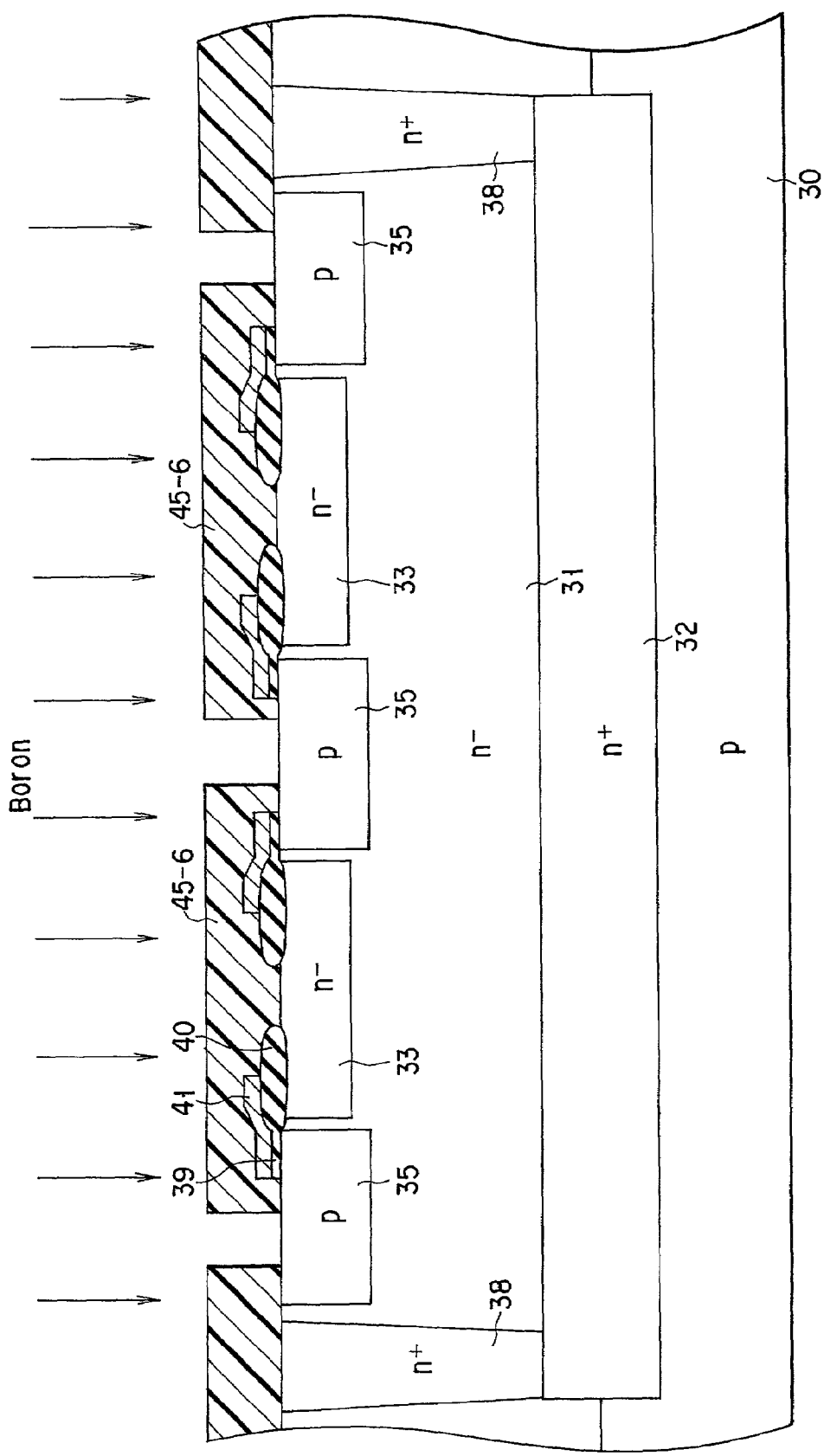

Next, the mask member 45-5 is removed from the epitaxial silicon layer 31. A mask member 45-6 is formed on the epitaxial silicon layer 31. Photolithography is performed, making openings in the member 45-6 as shown in FIG. 6J. Those parts of the silicon layer 31 in which contact regions 37 will be formed is exposed through the openings of the mask member 45-5. Using the mask pattern 45-6 as mask, a p-type impurity such as boron is introduced into the surfaces of the body regions 35, by means of ion implantation or the like.

The mask member 45-6 is removed from the epitaxial silicon layer 31. The silicon substrate 30 and the epitaxial silicon layer 31 are heat-treated, diffusing the impurities introduced into the offset regions 33 and body regions 35 in the steps described with reference to FIGS. 6I and 6J. The source regions 36, the drain regions 34 and contact regions 37 are thereby formed, as is illustrated in FIG. 3B. Further, source electrodes 43 and drain electrodes 42 are formed.

Thus, the MOS transistor according to this embodiment of the invention, which has the structure shown in FIGS. 3A and 3B, is manufactured.

Figure 7:
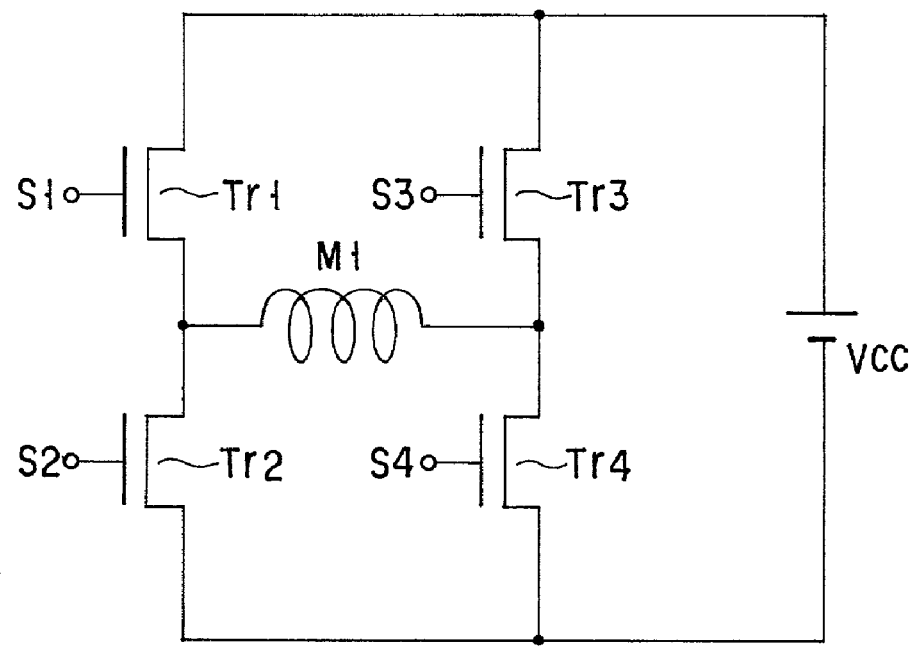
FIG. 7 is a circuit diagram of a motor driver that incorporates MOS transistors according to the first embodiment of this invention.

The use of the MOS transistor will be described. FIG. 7 is a circuit diagram of a motor driver that incorporates the MOS transistors according to the first embodiment of this invention.

The motor driver is an H-bridge circuit. As FIG. 7 shows, the H-bridge circuit comprises four MOS transistors Tr1 to Tr4 and a motor M1. The MOS transistor Tr1 has a gate to receive a signal S1, a drain connected to the power supply Vcc and a source. The MOS transistor Tr2 has a gate to receive a signal S2, a source connected to the ground and a drain connected to the source of the MOS transistor Tr1. The MOS transistor Tr3 has a gate to receive a signal S3, a drain connected to the power supply Vcc and a source. The MOS transistor Tr4 has a gate to receive a signal S4, a source connected to the ground and a drain connected to the source of the MOS transistor Tr3. The motor M1 is connected between the node of the transistors Tr1 and Tr2 and the node of the transistor Tr3 and Tr4. The transistors Tr1 to Tr4 are LDMOS transistors of the structure shown in FIGS. 3A and 3B.

In the motor driver of FIG. 7, the input signals S1 and S4 are set at high level to drive the motor M1. The MOS transistor Tr1 and Tr4 are then turned on. A current is therefore supplied to the motor M1, which is driven.

The MOS transistor Tr1 and Tr3 have their sources connected to the load, i.e., the motor M1. The transistor Tr1 and Tr3 are therefore used as high-side switches. On the other hand, the MOS transistor Tr2 and Tr4 have their sources connected to the ground. The transistor Tr2 and Tr4 therefore need to be used as low-side switches.

Although the MOS transistors Tr1 to Tr4 have the same structure, i.e., the structure of the LDMOS transistor shown in FIGS. 3A and 3B, they can be used as high-side switches and low-side switches. This is because buried layers 32 are provided at the interface between the epitaxial silicon layer 31 and the silicon substrate 30 in each of the MOS transistors Tr1 and Tr4. When a prescribed potential is applied to the buried layer 32, each transistor can function as either a high-side switch or a low-side switch. The use of the MOS transistors Tr1 to Tr4 therefore helps to simplify the method of manufacturing the motor driver. Additionally, the breakdown of the motor M1 can be reliably prevented since the MOS transistors Tr1 to Tr4 have a high breakdown voltage as has been described in conjunction with the first embodiment.

Figure 8A:
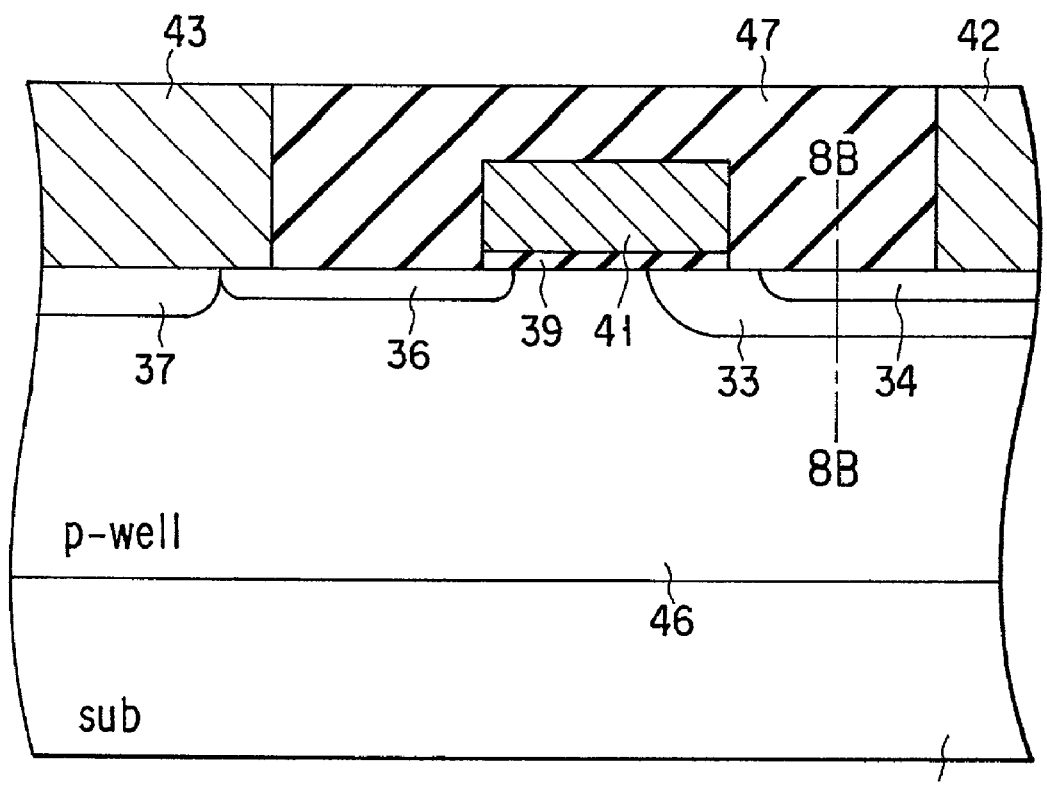
FIG. 8A is a sectional view showing a MOS transistor according to the second embodiment of the invention.

A MOS transistor according to the second embodiment of the invention will be described, with reference to FIG. 8A. FIG. 8A is a sectional view of this MOS transistor.

As FIG. 8A shows, a p-type well region 46 is provided in a surface of a silicon substrate 30. A source region ($n^+$-type impurity diffusion layer) 36 and an offset region ($n^-$-type impurity diffusion layer) 33 are provided in the surface of the well region 46 and isolated from each other. A contact region ($p^+$-type impurity diffusion layer) 37 is provided in the surface of the well region 46 and contacts the source region 36. A drain region ($n^+$-type impurity diffusion layer) 34 is provided in the surface of the offset region 33 and isolated from the well region 46. A gate insulating film 39 lies on the well region 46, extending from the source region 36 to the offset region 33. A gate electrode 41 is provided on the gate insulating film 39. An inter-layer insulating film 47 lies on the well region 46 and covers the gate electrode 41. Further, a source electrode 43 and a drain electrode 42 are provided in the inter-layer insulating film 47. Thus, an LDMOS transistor is made.

Figure 8B:
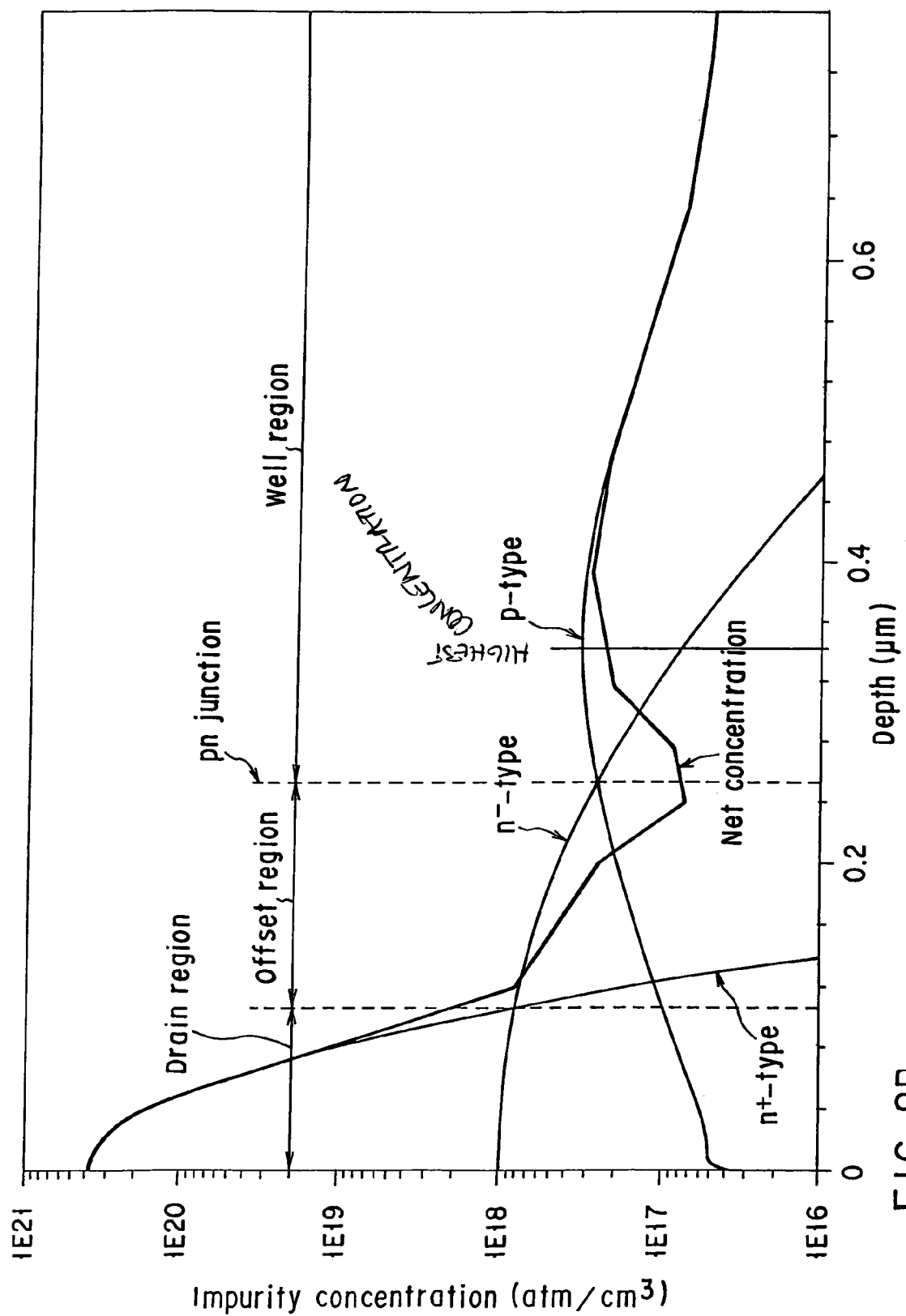
FIG. 8B is a graph illustrating the impurity-concentration profile in the plane taken along line 8B—8B shown in FIG. 8A.

FIG. 8B is a graph illustrating the impurity-concentration profile in the plane taken along line 8B—8B shown in FIG. 8A. The impurity concentration is plotted on the ordinate, whereas the depth from the drain region 34 is plotted on the abscissa. In FIG. 8B, "Net Concentration" is concerned with the net amount of the impurities introduced.

As seen from FIG. 8B, the drain region 34 is formed to the depth of about 0.11 μm from its surface. The offset region 33 is formed to the depth of about 0.25 μm from the surface of the drain region 34. In other words, the lower surface of the offset region 23 is at about twice the depth of the drain region 34. Hence, the pn junction between the offset region 33 and the well region 46 is located at a greater depth than in the conventional MOS transistor.

In the well region 46, the impurity concentration gradually increases from the upper surface, reaching the maximum value at a certain depth, and then gradually decreases toward the lower surface of the well region 46. As FIG. 8B shows, the well region 46 has a p-type impurity concentration of about $4 \times 10^{16}$ atm/cm$^3$ at the upper surface. The impurity concentration increases from the upper surface of the well region 46, reaching the maximum value of about $3 \times 10^{17}$ atm/cm$^3$ at the depth of about 0.28 μm from the upper surface of the well region 46. The impurity concentration then gradually decreases toward the lower surface of the well region 46. The impurity concentration at the pn junction between the offset region 33 and the well region 46 is about $2.5 \times 10^{17}$ atm/cm$^3$, whereas the impurity concentration at the pn junction in the conventional MOS transistor is only about $1.1 \times 10^{17}$ atm/cm$^3$.

Figure 1A:
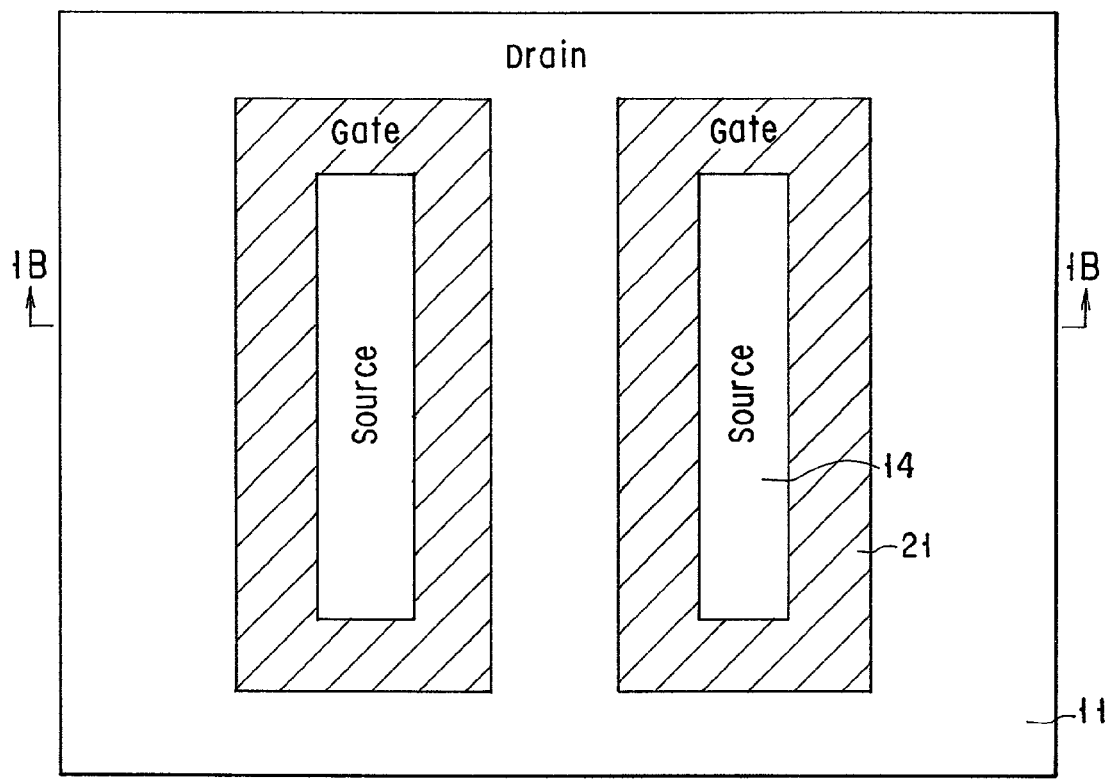
FIG. 1A is a plan view of a conventional MOS transistor.
Figure 2A:
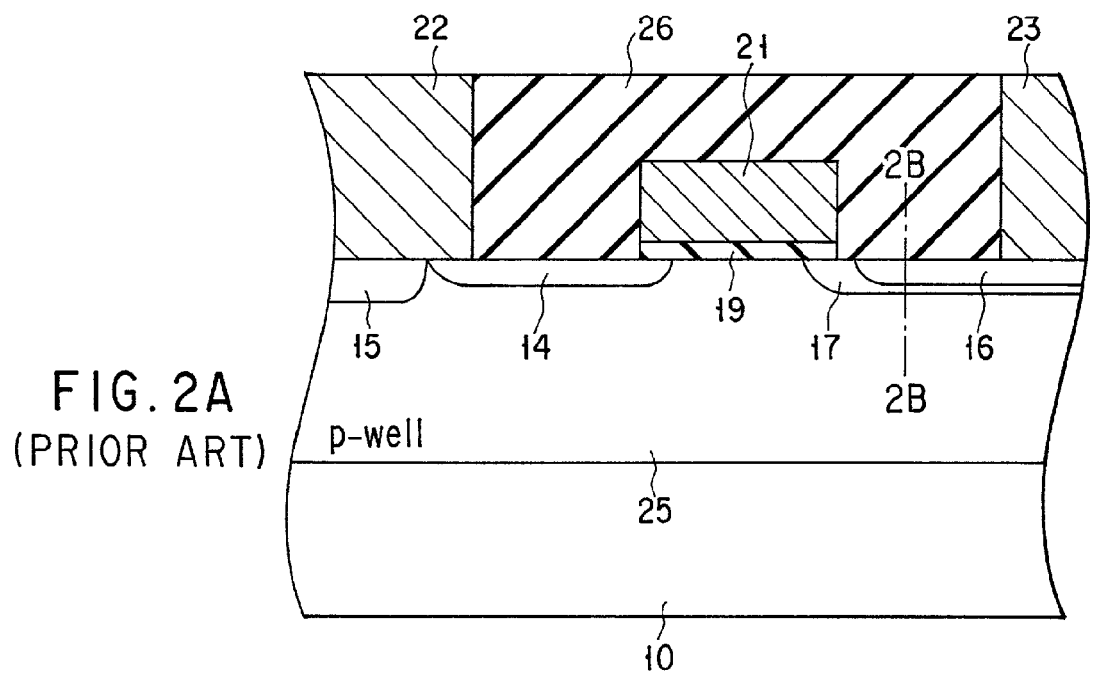
FIG. 2A is a sectional view of a conventional MOS transistor.
Figure 2B:
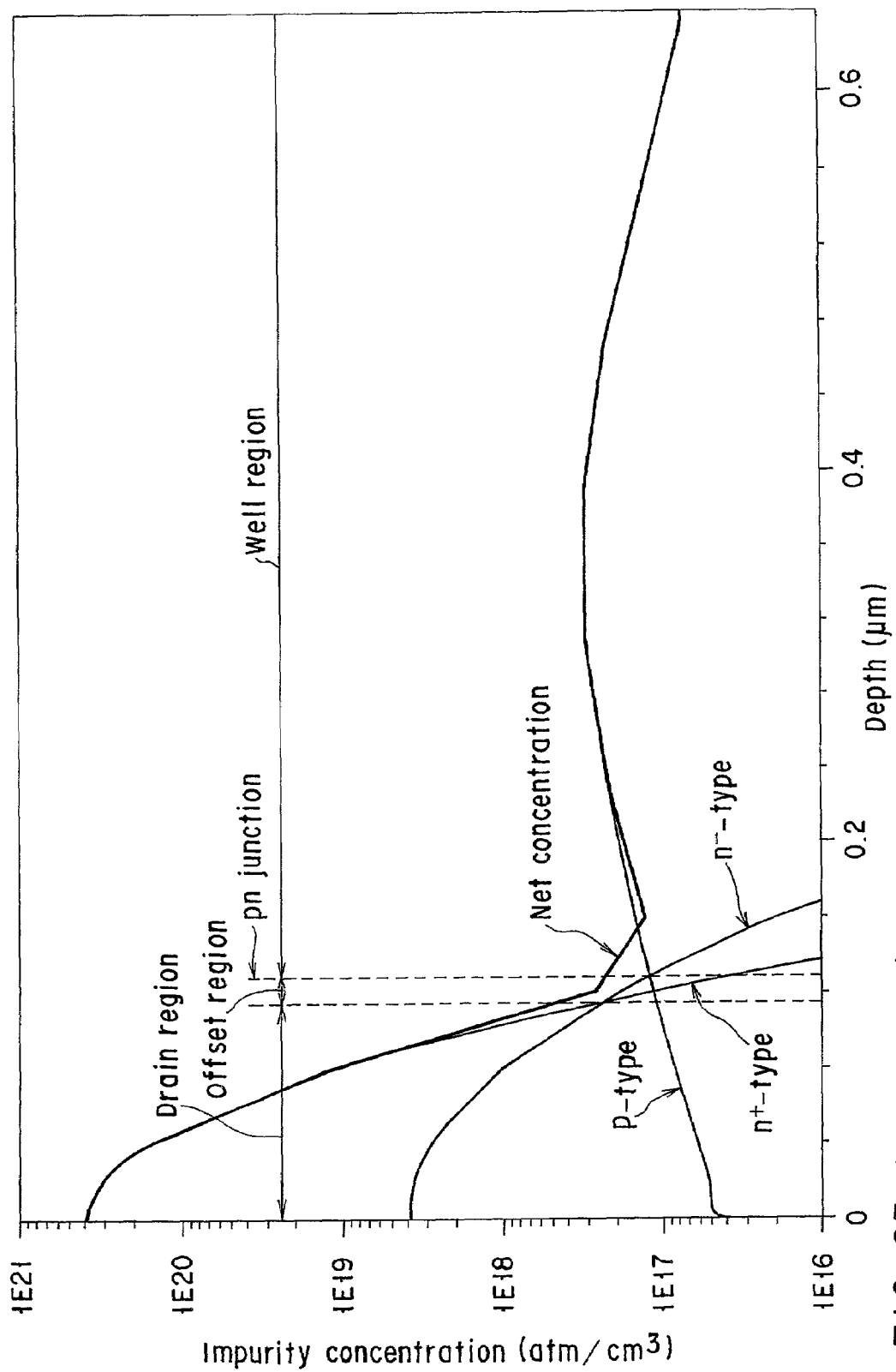
FIG. 2B is a graph representing the impurity-concentration profile in the plane taken along line 2B—2B shown in FIG. 2A.
Figure 9A:
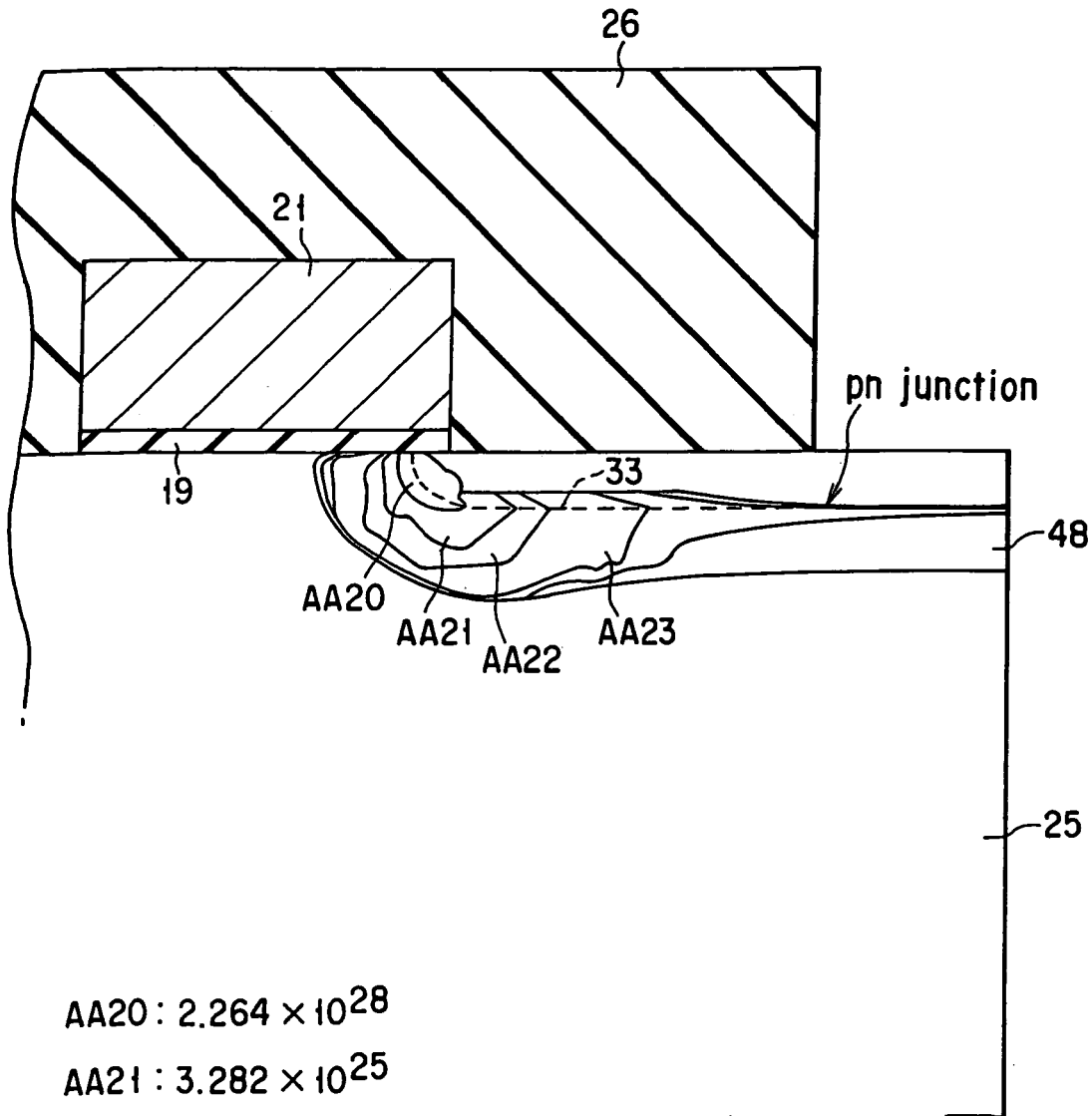
FIG. 9A is a diagram showing the distribution of impact-ionization generation rate that is observed in the structure of FIG. 2A.
Figure 9B:
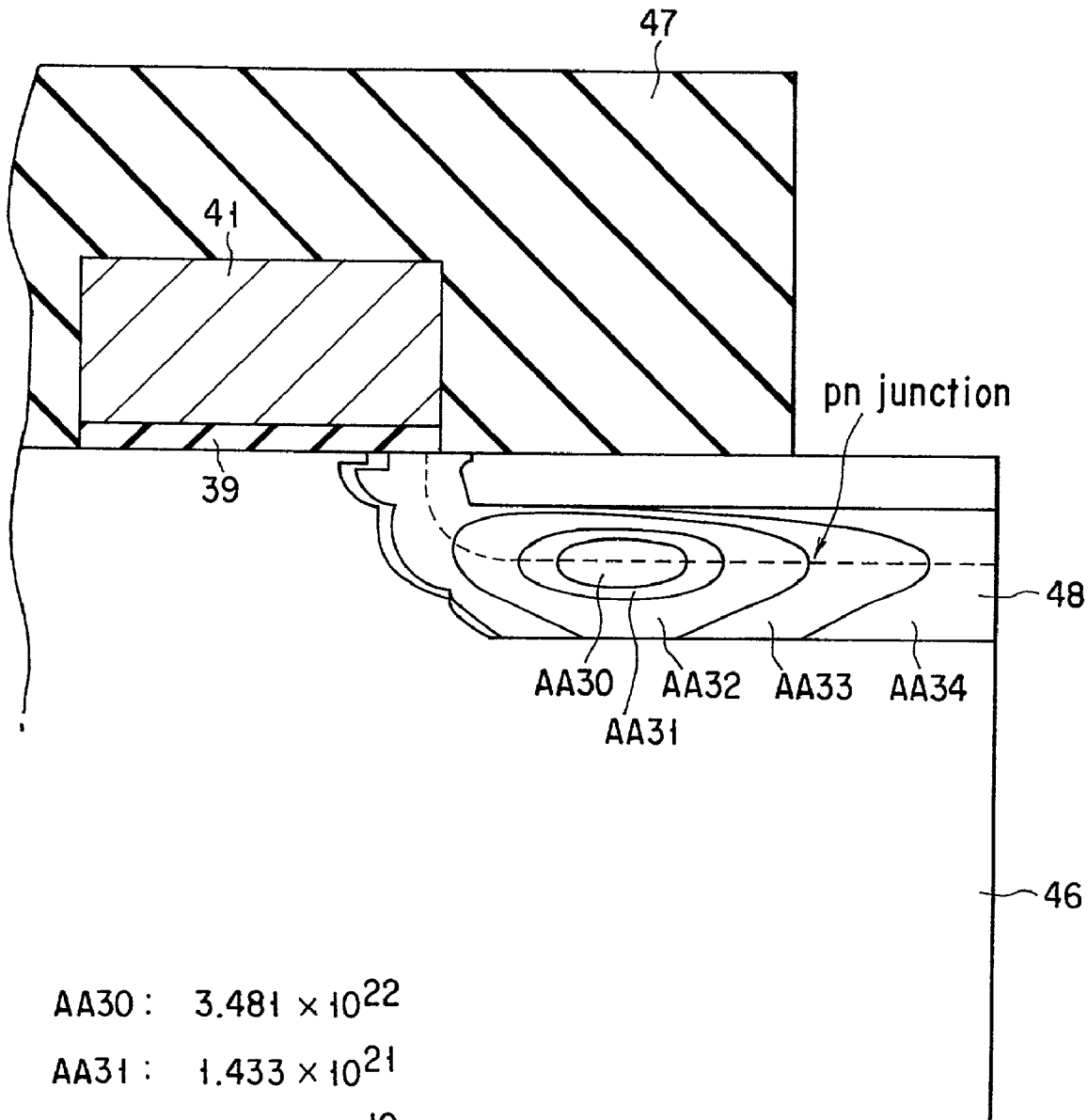
FIG. 9B is a diagram depicting the distribution of impact-ionization generation rate that is observed in the structure of FIG. 8A.

Having such a high impurity concentration, the pn junction prevents hot electrons from entering the gate insulating film, as will be explained with reference to FIGS. 9A and 9B. FIG. 9A is a diagram showing the distribution of impact-ionization generation rate that is observed in the structure of FIGS. 2A and 2B. FIG. 9B is a diagram depicting the distribution of impact-ionization generation rate that is observed in the structure of FIGS. 8A and 8B. Impact-ionization is a phenomenon in which electrons accelerated by an electric field impinge on atoms, releasing electrons from the atoms. Thus, impact-ionization results in avalanche breakdown. The region 48 shown in FIGS. 9A and 9B is a depletion layer formed by the pn junction between the well region 46 and offset region 33.

In the conventional LDMOS transistor, impact-ionization occurs most frequently in the region AA20 (impact-ionization generation rate $2.254 \times 10^{28}$/cm$^3$/s) provided immediately below the gate electrode 21, as is illustrated in FIG. 9A. That is, avalanche breakdown is most likely to take place in the region AA20, which forms a pn junction with the well region. This is because an electric field would concentrate at the edges of the gate electrode. It follows that impact-ionization will frequently occur in the region located immediately below the gate electrode and close to the edges thereof. At the pn junction between the well region, offset region and drain region, avalanche breakdown occurs first in the region right below the gate electrode. The hot electrons generated by the impact-ionization enter the gate insulating film 19. The avalanche breakdown at this pn junction inevitably changes the operating characteristics of the MOS transistor, such as the threshold voltage.

In the LDMOS transistor according to this embodiment of the invention, impact-ionization for unit time occurs most frequently in the region AA30 (impact-ionization generation rate: $3.481 \times 10^{22}$/cm$^3$/s) spaced apart from the gate electrode 41, as is seen from FIG. 9B. Avalanche breakdown is least likely to occur in the region AA34 ($1 \times 10^{17}$/cm$^3$/s) that is provided immediately below the gate electrode 41. This is because a depletion layer can hardly expand in the region AA30 that has a high impurity concentration. Therefore, an electric field is more concentrated at the region AA30 than at the edges of the gate electrode. Impact-ionization would occur most frequently in the region AA30. Since the region AA30 is spaced from the gate electrode, the hot electrons generated by the impact-ionization cannot enter the gate electrode. This prevents changes in the operating characteristics of the MOS transistor even if breakdown takes place at the pn junction between the well region, offset region and drain region.

In the MOS transistor according to the second embodiment, avalanche breakdown occurs at a position in the pn junction between the drain region and well region when a great potential difference develops between the drain region and the well region. This position is remote at a predetermined distance from the gate electrode. The predetermined distance is so long that the hot electrons generated from the avalanche breakdown cannot enter the gate insulating film. The distance depends on the breakdown voltage the MOS transistor should have. In view of this, it is not required that impact-ionization should occur most frequently at the deepest pn junction between the offset region and the well region as is illustrated in FIG. 9B. A case where impact ionization takes place most often at another position will be explained, with reference to FIGS. 10A and 10B.

Figure 10A:
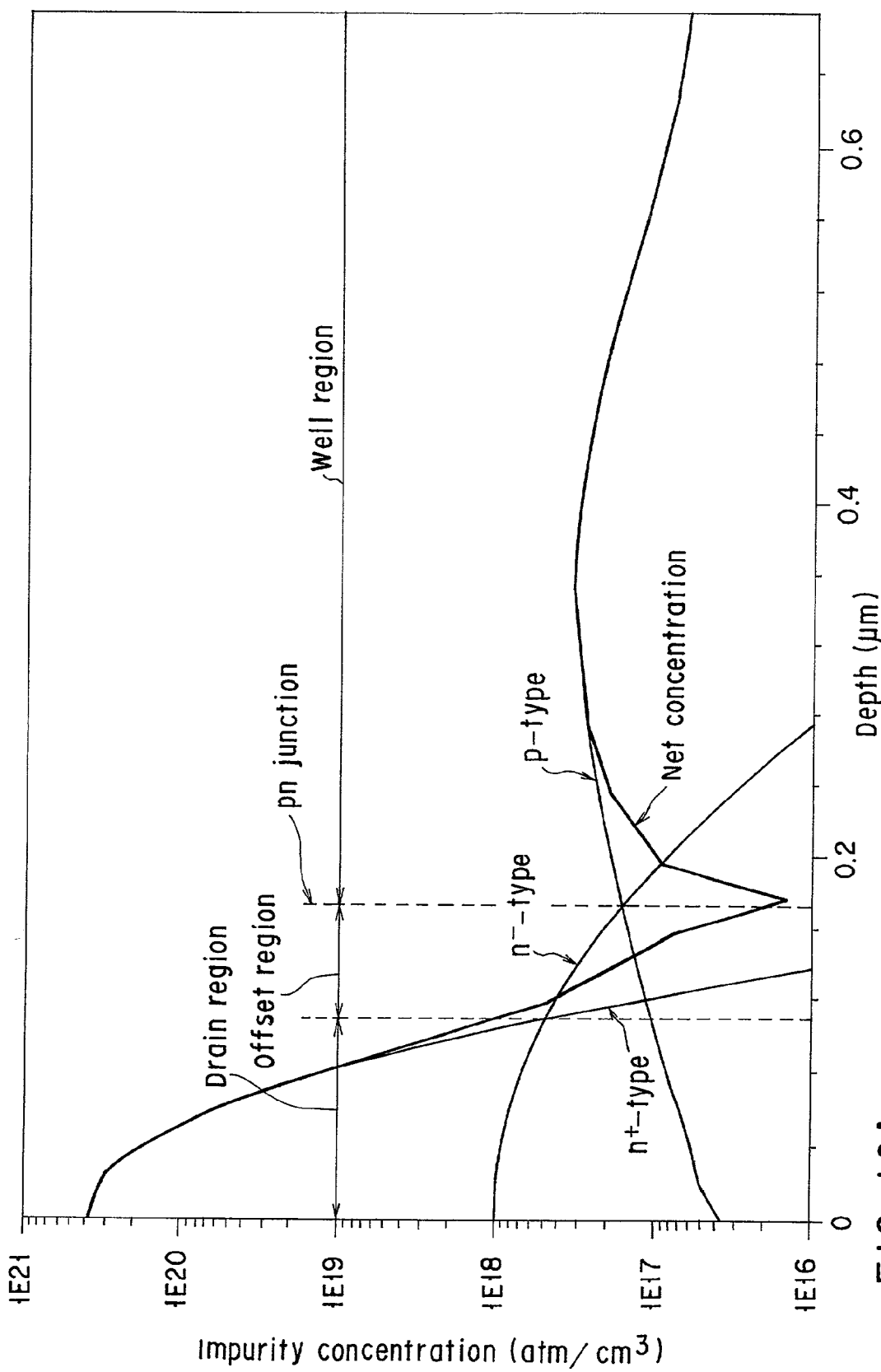
FIG. 10A is a graph illustrating the impurity-concentration profile in the plane taken along line 8B—8B shown in FIG. 8A.

FIG. 10A is a graph illustrating the impurity-concentration profile in the plane taken along line 8B—8B shown in FIG. 8A.

As seen from FIG. 10A, the drain region 34 is formed to the depth of about 0.11 μm from its surface and the offset region 33 is formed to the depth of about 0.17 μm from the surface of the drain region 34. The impurity concentration at the pn junction between the offset region 33 and the well region 46 is approximately $1.8 \times 10^{17}$ atm/cm$^3$.

Figure 10B:
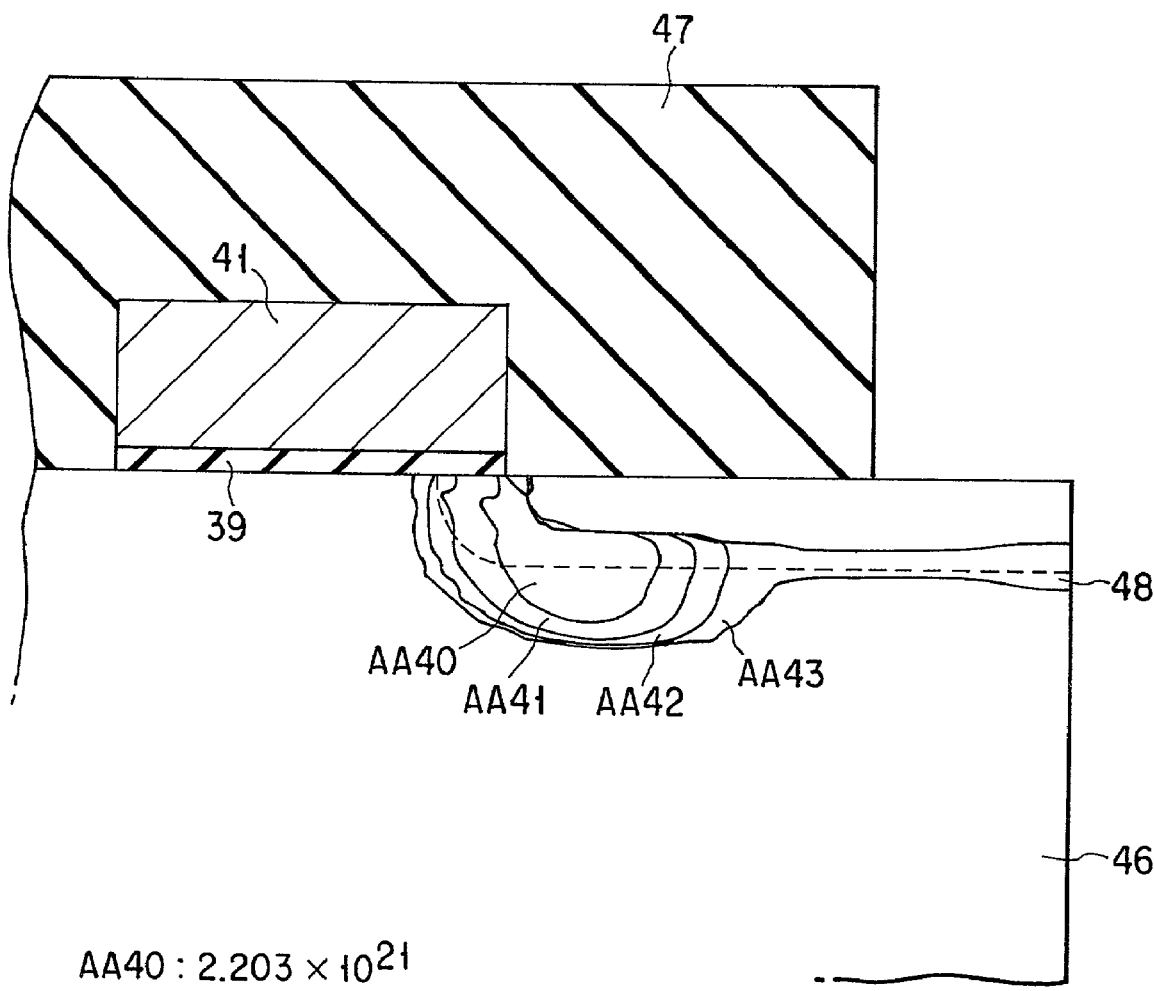
FIG. 10B is a diagram representing the distribution of impact-ionization generation rate that is observed in the MOS transistor that has the impurity-concentration profile of FIG. 10A.

FIG. 10B is a diagram representing the distribution of impact-ionization generation rate that is observed in the MOS transistor that has the impurity-concentration profile of FIG. 10A.

As FIG. 10B shows, the region having a high impact-ionization generation rate lies far below the gate electrode. Namely, the highest impact-ionization generation rate is observed in the region that lies between the region having the highest impact-ionization generation rate in FIG. 9A and the region having the highest impact-ionization generation rate in FIG. 9B. Thus, the region in which impact-ionization may occur most frequently can be selected in accordance with the breakdown voltage required of the MOS transistor and some other design factors.

As indicated above, the hot electrons generated by impact-ionization can be prevented from entering the gate insulating film in the MOS transistor according to the second embodiment of the invention. This enhances the operating reliability of the MOS transistor.

A method of manufacturing an LDMOS transistor of the structure shown in FIG. 8A, i.e. the second embodiment, will be described with reference to FIGS. 11A to 11E. FIGS. 11A to 11E are sectional views explaining the steps of this method.

Figure 11A:
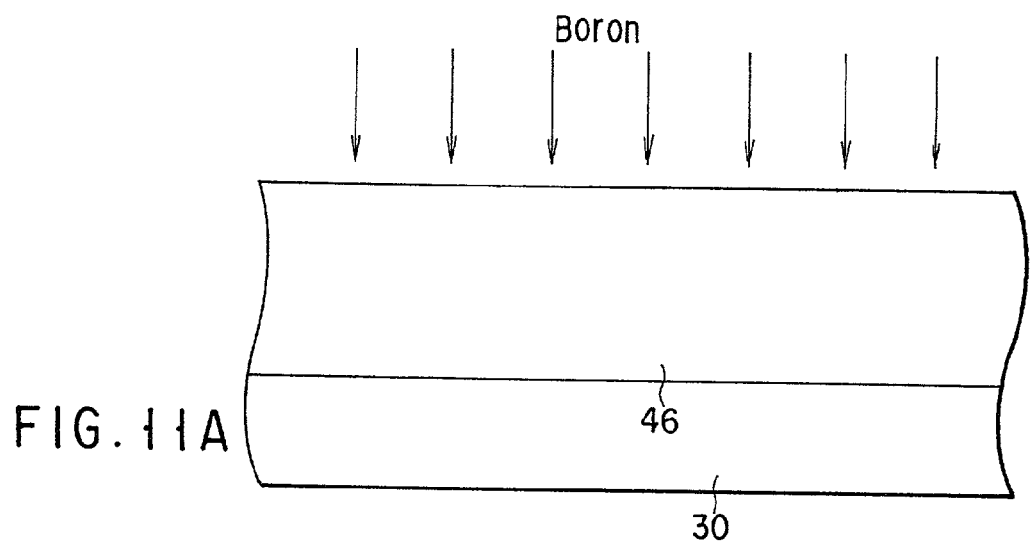
FIGS. 11A to 11E are sectional views explaining the steps of the method of manufacturing the MOS transistor according to the second embodiment of the invention.

First, as shown in FIG. 11A, a p-type impurity such as boron is introduced into an n-type silicon substrate 30 by ion implantation, for example at an acceleration voltage of 20 kV and a dose of $1.0 \times 10^{13}$ cm$^{-2}$. A p-type well region 46 is thereby formed in the surface of the silicon substrate 30.

Figure 11B:
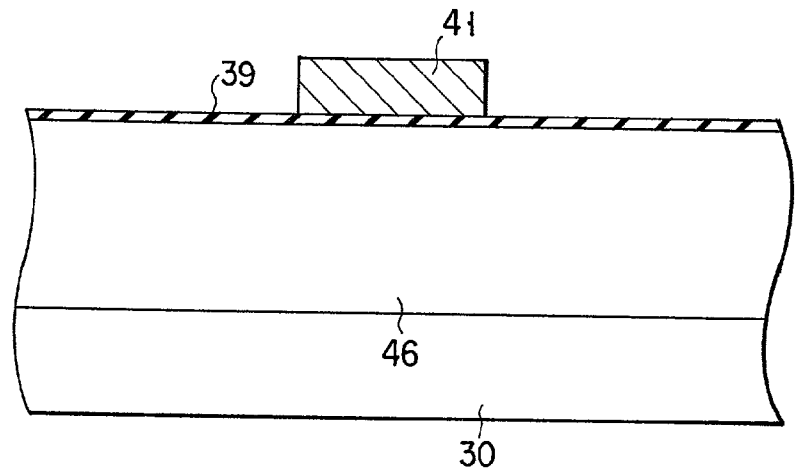

As shown in FIG. 11B, a gate insulating film 39 is formed on the silicon substrate 30. Further, a polycrystalline silicon film is formed on the gate insulating film 39. The polycrystalline silicon film is patterned, thus forming a gate electrode 41.

Figure 11C:
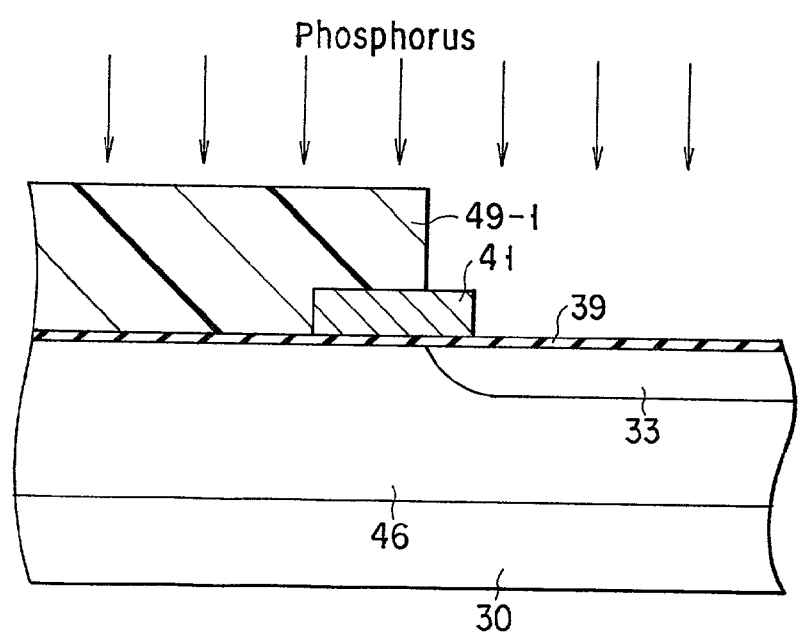

As FIG. 11C shows, a mask member 49-1 is formed on the gate insulating film 39, covering the gate electrode 41. Photolithography is carried out, making an opening in the mask member 49-1 and exposing that part of the well region 46 in which an offset region will be formed. Using the mask-member 49-1 as a mask an n-type impurity such as phosphorus is introduced into the surface of the well region 46 by means of ion implantation. The ion implantation is performed at an acceleration voltage of 100 kV and a dose of $8.0 \times 10^{13}$ cm$^{-2}$. An offset 33 is formed in the surface of the well region 46.

Figure 11D:
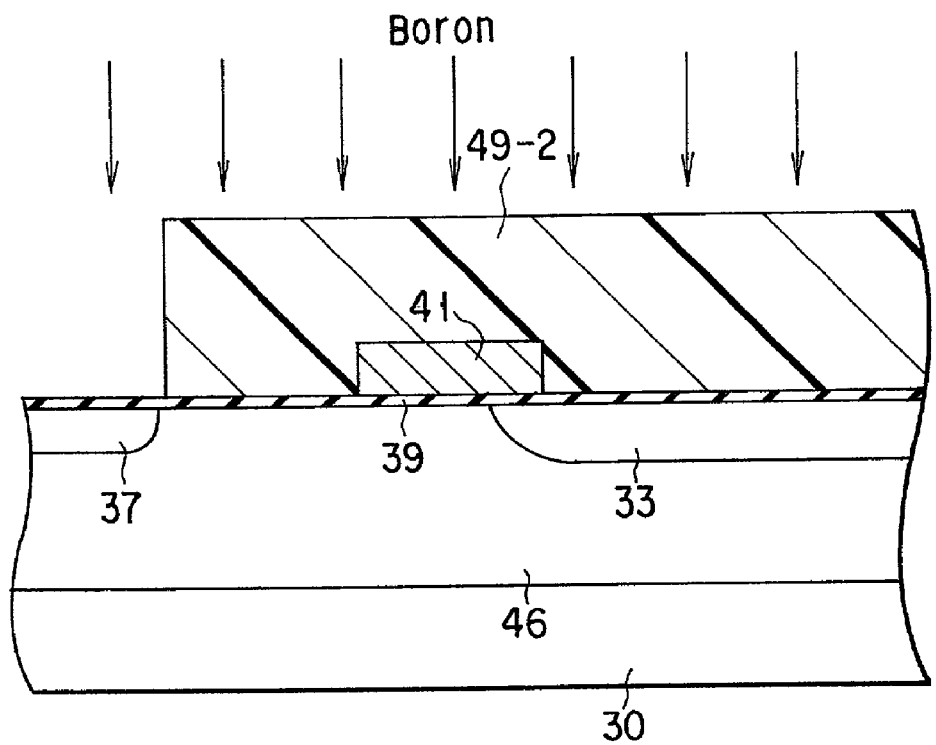

The mask member 49-1 is removed from the gate insulating film 39. Thereafter, a mask member 49-2 is formed on the gate insulating film 39 as is illustrated in FIG. 11D. Photolithography is performed, making an opening in the mask member 49-2 and exposing that part of the well region 46 in which a contact region will be formed. Then, using the mask member 49-2 as mask, a p-type impurity such as boron is introduced into the surface of the well region 46 by means of ion implantation or the like. A contact region 37 is thereby formed in the surface of the well region 46.

Figure 11E:
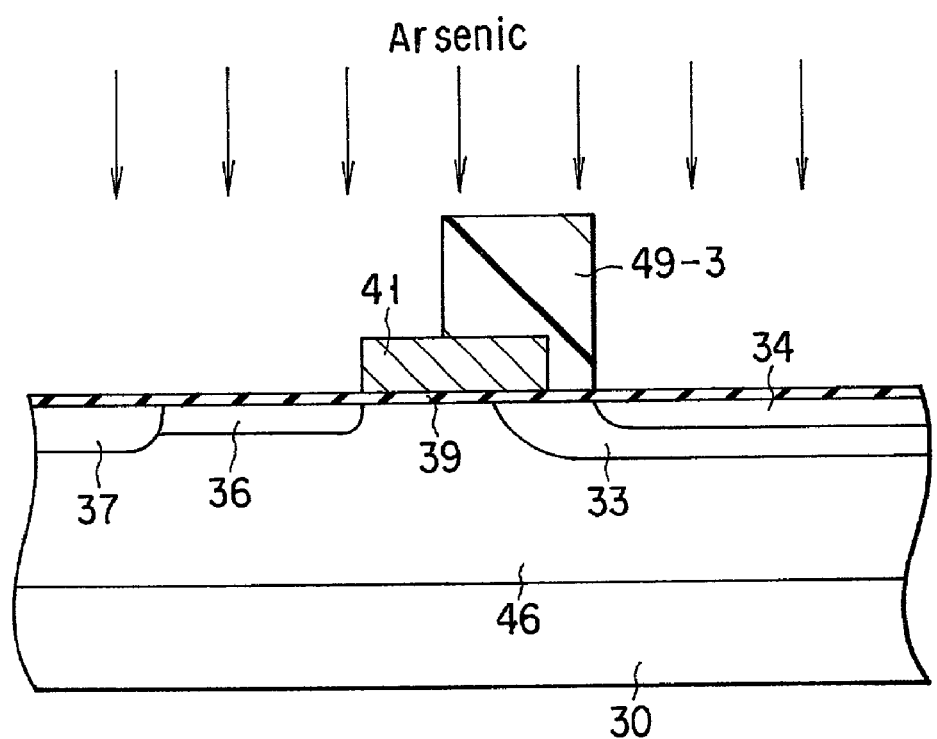

Next, the mask member 49-2 is removed from the gate insulating film 39. As shown in FIG. 11E, a mask member 49-3 is formed on the gate insulating film 39. Photolithography is performed, making an opening in the mask member 49-3 and exposing that part of the well region 46 in which a source region and a drain region will be formed. Using the mask member 49-3 as mask, an n-type impurity such as arsenic is introduced into the surface of the well region 36 by means of ion implantation. A source region 36 and a drain region 34 are thereby formed in the surface of the well region 46.

Next, the mask member 49-3 is removed from the gate insulating film 39. Thereafter, an inter-layer insulating film 47 is deposited on the gate insulating film 39, covering the gate electrode 41. A source electrode 43 and a drain electrode 42 are formed. Thus, there is manufactured an LDMOS transistor having the structure shown in FIGS. 8A and 8B.

As has been described, the MOS transistor according to the first embodiment of this invention can have a high breakdown voltage. The MOS transistor according to the second embodiment of the invention can exhibit high operation reliability. Both embodiments exemplified above are MOS transistors. Nevertheless, the present invention can be applied to other electronic elements such as an IGBT (Insulated Gate Bipolar Transistor) and a diode. The materials and numerical values specified in describing the embodiments may be replaced or changed, so long as they help to achieve the advantages of this invention.

Additional advantages and modifications will readily occur to those skilled in the art. Therefore, the invention in its broader aspects is not limited to the specific details and representative embodiments shown and described herein. Accordingly, various modifications may be made without departing from the sprint or scope of the general inventive concept as defined by the appended claims and their equivalents.

What is claimed is:

1. A semiconductor device comprising:
    a semiconductor region of a first conductivity type;
    a drain region of the first conductivity type, provided in a surface of the semiconductor region and shaped like a stripe;
    an offset region of the first conductivity type, provided in the surface of the semiconductor region and surrounding the drain region;
    a body region of the second conductivity type, provided in the surface of the semiconductor region and having a shape surrounding the offset region and the drain region on all sides in a horizontal plane of the semiconductor region;

a source region of the first conductivity type, provided in a surface of the body region and having a shape surrounding the offset region and the drain region on all sides in a horizontal plane of the semiconductor region;

a gate insulating film provided on that part of the body region which lies between the offset region and the source region; and a gate electrode provided on the gate insulating film.

2. The semiconductor device according to claim 1, wherein the offset region and the semiconductor region have impurity concentrations lower than that of the body region.

3. The semiconductor device according to claim 1, wherein a depletion layer provided at a junction between the body region and the semiconductor region and a depletion layer provided at a junction between the body region and the offset region expands more in the semiconductor region and the offset region than in the body region.

4. The semiconductor device according to claim 1, wherein the body region has rounded corners.

5. The semiconductor device according to claim 1, wherein the semiconductor region is an epitaxially grown layer provided on a semiconductor substrate of the second conductivity type.

6. The semiconductor device according to claim 5, further comprising:

a buried region of the first conductivity type, provided between the semiconductor substrate and the semiconductor region; and a sinker layer provided in the semiconductor region and extending from a surface of the semiconductor region to the buried region.

7. The semiconductor device according to claim 6, wherein the buried region is connected to the drain region electrically.

8. A semiconductor device comprising:

a semiconductor region of a first conductivity type;

an offset region of the second conductivity type, provided in a surface of the semiconductor region, the impurity dominant in the offset region being diffused to a position deeper than a position where concentration of an impurity of the first conductivity type is highest in the semiconductor region, the offset region being formed in such a manner that it has a smaller depth than the position where concentration of the impurity of the first conductivity type is highest in the semiconductor region;

a drain region of the second conductivity type, provided in a surface of the offset region;

a source region of the second conductivity type, provided in the surface of the semiconductor region and isolated from the offset region;

a gate insulating film provided on that part of the semiconductor region which lies between the offset region and the source region; and a gate electrode provided on the gate insulating film, the position where the concentration of the impurity of the first conductivity type is highest in the semiconductor region being shallower than the position where the concentration of the impurity dominant in the offset region is $1/10$ the highest concentration of the impurity of the first conductivity type in the semiconductor region.

9. The semiconductor device according to claim 8, wherein breakdown at the pn junction between the offset region and the semiconductor region occurs first in a junction between the semiconductor region and that part of the offset region which lies immediately below the drain region and then in a junction between the semiconductor region and that part of the offset region which lies close to the gate electrode.

10. The semiconductor device according to claim 8, wherein the junction between the semiconductor region and that part of the offset region which lies immediately below the drain region has an impurity concentration higher than that of the junction between the semiconductor region and that part of the offset region which lies close to the gate electrode.

11. The semiconductor device according to claim 8, wherein a depletion layer formed at the junction between the semiconductor region and that part of the offset region which lies immediately below the drain region is narrower than a depletion layer formed at the junction between the semiconductor region and that part of the offset region which lies close to the gate electrode.

12. A semiconductor device comprising:

a semiconductor region of a first conductivity;

a drain region provided in a surface of the semiconductor region;

a source region provided in the surface of the semiconductor region and isolated from the drain region;

an offset region provided in the surface of the semiconductor region, isolated from the source region, covering the drain region and having a first region and a second region, said first region being a surface region of the offset region and including a carrier path extending between the source region and the drain region, said second region being the remaining region of the offset region;

a gate insulating film provided on that part of the semiconductor region which lies between the offset region and the source region; and a gate electrode provided on the gate insulating film;

wherein the junction between the semiconductor region and the second region has an impurity concentration higher than that of the junction between the semiconductor region and the first region, and when a breakdown voltage at a pn junction between the offset region and the semiconductor region is applied to a junction between the source region and the drain region, breakdown occurs at a junction between the second region and the semiconductor region before breakdown occurs at the junction between the first region and the semiconductor region.

13. The semiconductor device according to claim 12, wherein a depletion layer formed at the junction between the semiconductor region and the second region is narrower than a depletion layer formed at the junction between the semiconductor region and the first region.

14. The semiconductor device according to claim 12, wherein the second region lies deeper in the offset region than the drain region.

15. The semiconductor device according to claim 12, wherein the second region lies in the offset region, immediately below the drain region.

16. The semiconductor device according to claim 12, wherein said semiconductor region has an impurity concentration profile in which the impurity concentration gradually increases from the surface.

17. A semiconductor device comprising:

a semiconductor region of a first conductivity type;

a drain region of the first conductivity type, provided in a surface of the semiconductor region and shaped like a stripe;

an offset region of the first conductivity type, provided in the surface of the semiconductor region and surrounding the drain region;

a body region of the second conductivity type, provided in the surface of the semiconductor region and having a shape that encircles all peripheries of the offset region and the drain region on all sides in a horizontal plane of the semiconductor region;

a source region of the first conductivity, provided in a surface of the body region and having a shape that encircles all peripheries of the offset region and the drain region on all sides in a horizontal plane of the semiconductor region;

a gate insulating film provided on that part of the body region which lies between the offset region and the source region; and a gate electrode provided on the gate insulating film.

18. A semiconductor device comprising:

a semiconductor region of a first conductivity type;

an offset region of the second conductivity type, provided in a surface of the semiconductor region;

a drain region of the second conductivity, provided in a surface of the offset region;

a source region of the second conductivity type, provided in the surface of the semiconductor region and isolated from the offset region;

a gate insulating film provided on that part of the semiconductor region which lies between the offset region and the source region; and a gate electrode provided on the gate insulating film, in a region where the drain region, the offset region and the semiconductor region overlap one another, the impurity dominant in the offset region being diffused to a position deeper than a position where the concentration of an impurity of the first conductivity type is highest in the semiconductor region;

in the region where the drain region, the offset region and the semiconductor region overlap one another, the offset region being formed in such a manner that it has a smaller depth than the position where the concentration of the impurity of the first conductivity type is highest in the semiconductor region; and the position where the concentration of the impurity of the first conductivity type is highest in the semiconductor region being shallower than the position where the concentration of the impurity dominant in the offset region is $\frac{1}{10}$ the highest concentration of the impurity of the first conductivity type in the semiconductor region.

* * * * *